United States Patent [19]
Tom

[11] Patent Number: 5,151,395
[45] Date of Patent: Sep. 29, 1992

[54] BULK GAS SORPTION AND APPARATUS, GAS CONTAINMENT/TREATMENT SYSTEM COMPRISING SAME, AND SORBENT COMPOSITION THEREFOR

[75] Inventor: Glenn M. Tom, New Milford, Conn.

[73] Assignee: Novapure Corporation, Danbury, Conn.

[21] Appl. No.: 495,790

[22] Filed: Mar. 16, 1990

Related U.S. Application Data

[60] Continuation-in-part of Ser. No. 295,419, Jan. 10, 1989, Pat. No. 5,037,624, which is a continuation-in-part of Ser. No. 163,792, Mar. 3, 1988, Pat. No. 4,953,792, which is a division of Ser. No. 29,632, Mar. 24, 1987, Pat. No. 4,761,395, which is a continuation-in-part of Ser. No. 323,311, Mar. 11, 1989.

[51] Int. Cl.⁵ .................... B01J 20/18; B01J 20/02
[52] U.S. Cl. ...................... 502/67; 502/407
[58] Field of Search ............... 502/67, 407; 423/240 S

[56] References Cited

U.S. PATENT DOCUMENTS

| | | | |
|---|---|---|---|
| 4,610,700 | 9/1986 | Miller et al. | 502/67 |
| 4,761,395 | 8/1988 | Tom et al. | 502/401 |
| 4,853,148 | 8/1989 | Tom et al. | 423/240 S |
| 4,983,363 | 1/1991 | Tom et al. | 422/180 |
| 5,037,624 | 8/1991 | Tom et al. | 423/210 |

FOREIGN PATENT DOCUMENTS 150886  9/1981  Fed. Rep. of Germany ........ 502/67

OTHER PUBLICATIONS

Braker, W., and Mossman, A. L., "Matheson Gas Data Book", Matheson Gas Products Inc., Secaucus, N.J. (1980).

Abe Y. and Sugiyama, H., "Treatment of Semiconductor Manufacturing Plant Exhaust Gases", PPM, 16[6], 4042 (1985).

Eiger, L. L., Toxic Gas Monitoring for Chemical Vapor Deposition Process Systems presented at STEP/SEMI, May 23, 1986.

Flaherty E. and Brookman, R. P., Treatments of Gaseous Effluents and Semiconductor Plants presented at STEP/SEMI, May 23, 1986.

Mistry, C., Ohno, Y., and Urata, T., Progress in Semiconductor Process Exhaust Gas Treatment Technology in Japan presented at STEP/SEMI, May 23, 1986.

Calgon Carbon Corporation, "Ventsorb® for Industrial Air Purification", Bulletin 23–56b–1986.

Primary Examiner—Carl F. Dees
Attorney, Agent, or Firm—Steven J. Hultquist

[57] ABSTRACT

A sorbent composition comprising a first sorbent bed of hygroscopic aluminosilicate sorbent and a second sorbent bed comprising an aluminosilicate sorbent impregnated with an aqueous base solution, whereby the hygroscopic aluminosilicate sorbent provides an initial contact zone to protect upstream gas and processing equipment from reaction products resulting from back-diffusion of water which will occur in the absence of the first sorbent.

11 Claims, 11 Drawing Sheets

BULK GAS SORPTION AND APPARATUS, GAS CONTAINMENT/TREATMENT SYSTEM COMPRISING SAME, AND SORBENT COMPOSITION THEREFOR

CROSS-REFERENCE TO RELATED APPLICATIONS

This is a continuation-in-part of U.S. application Ser. No. 295,419 filed Jan. 10, 1989 now U.S. Pat. No. 5,037,624 in the names of Glenn M. Tom, James V. McManus, and Bruce A. Luxon, which in turn is a continuation-in-part of U.S. application Ser. No. 163,792 Filed Mar. 3, 1988 now U.S. Pat. No. 4,903,792 in the names of Glenn M. Tom and Duncan W. Brown, which in turn is a division of U.S. application Ser. No. 029,632 filed Mar. 24, 1987 and now issued as U.S. Pat. No. 4,761,395; and this application is also a continuation-in-part of U.S. application Ser. No. 323,311 filed Mar. 11, 1989 in the names of Glenn M. Tom and James V. McManus.

BACKGROUND OF THE INVENTION

1. Field of the Invention

This invention relates to bulk gas sorption apparatus, compositions, and associated processes, and to gas containment/ treatment systems comprising and/or arranged to practice same. The invention has particular utility for effecting bulk sorptive treatment of hazardous gases containing Group II-VII elements of the Periodic Table, such as are widely encountered in the manufacture of semiconducting materials and semiconductor devices.

2. Description of the Related Art

In the manufacture of semiconducting materials and semiconductor devices, a wide variety of hazardous gases are employed or produced, with specific hazards being associated with toxicity, corrosivity, pyrophoricity, and flammability characteristics of such gases.

Among these hazardous gases are those containing elements from Groups II-VII of the Periodic Table. As used herein, the term "gases" will be understood to include vapors as well as gases per se.

The aforementioned hazardous gases may derive from organometallic source reagents employed as precursor materials for the deposition of elemental metals on the semiconductor substrate, as for example by chemical vapor deposition (CVD) techniques. Other hazardous gases are employed in cleaning semiconductor manufacturing equipment such as reactor tubes and susceptors, and/or as etchants for the manufacture of microcircuitry devices.

Illustrative of hazardous gas compounds which contain Group II-VII constituent elements and which are commonly encountered in the semiconductor industry are the following compounds: (Group II) organic compounds of beryllium, magnesium, zinc, cadmium, and mercury; (Group III) organic compounds of aluminum, gallium, and indium, as well as hydrides of boron; (Group IV) silane, and halosilanes; germane; and certain fluorinated etching agents and products; (Group V) hydrides of nitrogen, phosphorus, and arsenic, as well as alkylarsine and alkyl-phosphine compounds; (Group VI) hydrides of sulfur, selenium, and tellurium, as well as alkylselenium and alkyltellurium compounds; and (Group VII) hydrogen halides (fluorides, chlorides, bromides, and iodides).

Many of the aforementioned gaseous compounds are employed as source gases in semiconductor manufacturing, and are provided in high pressure gas cylinders at the semiconductor facility. The cylinders in turn are stored in gas cabinets, which are essentially enclosures for the gas cylinders and associated piping and flow equipment (e.g., regulators, flow meters, pressure sensors, mass flow controllers, etc.). These gas cabinets are ventilated to minimize the danger to persons in their vicinity of exposure to these hazardous gases. A listing of illustrative hazardous gases which are employed in the semiconductor industry and are supplied in high pressure gas cylinders, is set out in Table I below (as taken from Braker, W., and Mossman, A. L., "Matheson Gas Data Book," Matheson Gas Products, Inc, Secaucus, NJ (1980)). As used in the following table, the term "TLV" means Threshold Limit Value and the values represented by "TLV-TWA" refer to the time-weighted average concentration for a normal eight-hour workday and forty-hour work week, to which nearly all workers may be repeatedly exposed, day after day, without adverse affects.

TABLE I

| Hazardous Gaseous Compound | Chemical Form. | TLV-TWA (ppm) | | Hazard |
|---|---|---|---|---|
| Arsine | $AsH_3$ | 0.05 | | Extremely toxic |
| Phosphine | $PH_3$ | 0.3 | | Extremely toxic |
| Hydrogen Fluoride | HF | 3.0 | (TLV-C) | Corrosive |
| Hydrogen Chloride | HCl | 5.0 | (TLV-C) | Corrosive |
| Hydrogen Bromide | HBr | 3.0 | (TLV-C) | Corrosive |
| Silane | $SiH_4$ | 5.0 | | Pyrophoric |
| Dichlorosilane | $SiH_2Cl_2$ | 5.0 | | Corrosive |
| Diborane | $B_2H_6$ | 0.1 | | Toxic, pyrophoric |

The aforementioned gaseous compounds are employed in widely varying concentrations in semiconductor manufacturing plants, as constituents of process gas streams, which due to their hazardous compounds must be carefully contained and treated so that they are not released into the environment.

As a result of the foregoing safety and toxicity considerations, significant effort has been expended in developing compositions and treatment systems for removing such hazardous gaseous compounds from gaseous streams which are utilized in or generated by semiconductor manufacturing facilities. See, for example, Abe, Y and Sugiyama, H., "Treatment of Semiconductor Manufacturing Plant Exhaust Gases," PPM, 16[6], 40-52 (1985); Eiger, L. L., "Toxic Gas Monitoring for Chemical Vapor Deposition Process Systems," presented at STEP/SEMI Technical Education Programs "Safety Aspects of Effluents From CVD Process Systems," May 23, 1986; Flaherty, E. and Brookman, R. P., "Treatments of Gaseous Effluents from Semiconductor Plants," presented at STEP/SEMI Technical Education Programs "Safety Aspects of Effluents From CVD Process Systems," May 23, 1986; and Mistry, C., Ohno, Y., and Urata, T., "Progress in Semiconductor Process Exhaust Gas Treatment Technology in Japan," presented at STEP/SEMI Technical Education Programs "Safety Aspects of Effluents From CVD Process Systems," May 23, 1986.

Among the treatment technologies that have come into usage for removal of Group II-VII elements and compounds from semiconductor plant gaseous effluents are combustion, chemical oxidation, and activated carbon treatment of the effluent streams. Each of these treatment methodologies is discussed in turn below.

In the combustion treatment of semiconductor manufacturing effluent gases, "burn boxes" frequently are employed to achieve substantially complete oxidation of the hazardous gases in the effluents. The resulting oxidized products in the combusted effluent gas stream then are trapped by aqueous scrubbing of the gas stream. Such combustion treatment has the significant disadvantage that large volumes of relatively dilute liquid and solid wastes are produced as combustion by-products. Further, such combustion is very costly, particularly for small-scale semiconductor manufacturing operations.

Chemical oxidation also has been employed to treat semiconductor plant gaseous effluent streams containing Group II-VII constituents, utilizing aqueous oxidizing agents such as acidic potassium permanganate ($KMnO_4$) and sodium hypochlorite, to oxidize arsine, phosphine, silane, and diborane, to yield water soluble materials or precipitates. This treatment methodology also suffers the disadvantage of generating large volumes of dilute waste by-products. In addition, since substantial energy is released in these chemical oxidation reactions, explosive conditions can be created, thereby posing a serious risk of damage and/or injury in the semiconductor manufacturing plant.

The use of activated carbon beds to physically sorb hazardous Group II-VII constituents from semiconductor manufacturing effluent gas streams is well established (see, for example, Ito, F., Kobayashi, M., and Abe, T., "Waste Gas Detoxification," Japanese Kokai Tokkyo Koho JP 61/118117A2 [86/118117], Jun. 5 1986; Sugiyam, M., Kudo, S., and Okinori, H., "Agents for Removing Arsenic Compounds," Japanese Kokai Tokkyo Koho JP 60/238144 A2 [85/238144], Nov. 27, 1985; Bogdanov, V. M., Shumyatskii, Yu. I., Moisechuk, 0. V., Suchkova, Z. A., Neshumova, S. P., Fedorovskaya, V. V., and Chugunova, G. I., "Removal of Impurities of Phosphine and Arsine from Gases," U.S.S.R. SU 1181692A1, Sep. 30, 1985; and Calgon Carbon Corporation, "Ventsorb® for Industrial Air Purification," Bulletin 23-56b-1986).

Nonetheless, activated carbon treatment in such application suffers the disadvantage that the sorptive affinity of activated carbon for the Group II-VII hazardous gas constituents of the semiconductor manufacturing process effluent streams is generally relatively low, under normal effluent process (temperature, pressure) conditions. As a result, very large volumes of activated carbon are required to effectively remove the hazardous gas components, in order to achieve concentrations of such hazardous components in the treated gaseous effluent which are below their Threshold Limit Value (TLV).

To meet TLV effluent standards, then, it frequently is necessary to provide massive beds of activated carbon which, in addition to the considerable capital equipment and operating costs associated therewith, are difficult to effectively control and regenerate for optimum usage of the sorbent material.

In prior copending U.S. patent application Ser. No. 07/163,792 filed Mar. 3, 1988 and prior issued U.S. Pat. No. 4,761,395, the disclosures of which hereby are incorporated by reference herein, there is disclosed a scavenger composition having utility for purifying a gaseous mixture comprising (i) a primary component selected from one or more members of the group consisting of arsine, phosphine, ammonia, and inert gases, and (ii) impurities selected from one or more members of the group consisting of Lewis acids and oxidants. This scavenger composition comprises a support having associated therewith, but not covalently bonded thereto, an anion which is reactive to effect the removal of the impurities from the gaseous mixture, the anion being selected from one or more members of the group consisting of:

(1) carbanions whose corresponding protonated compounds have a $pK_a$ value of from about 22 to about 36: and (2) anions formed by reaction of the carbanions with the primary component of the mixture.

There is a continuing need in the art for improved technology to contain and treat hazardous gases containing Group II-VII constituents, as are used and emitted in the manufacture of semiconductor materials and devices. Such need is particularly acute in instances where concentrated reagent gases may be released into the ambient environment as a result of reagent container and/or flow circuitry failure.

An example is the situation arising when a gas cylinder of a hazardous reagent such as arsine is connected to a manifold by a regulator which is defective, or in use breaks down, resulting in leakage of arsine to the surrounding air. In such instances, there had not been developed any suitable means of "quenching" the arsine leak in any safe and effective manner. Instead, semiconductor manufacturing workers have been forced to don protective apparel and breathing devices and to place the defective regulator and cylinder unit in an exterior environment, for dilution by and dispersal to the ambient atmosphere, and/or in a bath of strong oxidizing materials such as aqueous potassium permanganate solution. These expedients are highly undesirable. Ambient air discharge may create health and safety concerns as well as constitute air pollution activity which may violate legislative or regulatory constraints on hazardous material emissions. Bulk potassium permanganate contacting is also undesirable, due to the resulting highly exothermic reaction of the arsine with potassium permanganate, and the potential for explosion.

However, in prior copending U.S. application Ser. No. 295,419 filed Jan. 10, 1989 in the names of Glenn M. Tom, James V. McManus, and Bruce A. Luxon, the disclosure of which hereby is incorporated herein by reference, there are described gas sorption compositions and apparatus for removing Group II-VII gaseous constituents in single component (pure) form, or from gas mixtures containing same. These gas sorption compositions comprise active scavengers which affect removal of the Group II-VII constituents by nucleophilic substitution, deprotonation, and/or oxidation modes of reaction.

There is a continuing need for improvements in the technology of containment and treatment of leakages of hazardous gaseous compounds, and in recent years specific concerns have been focused on the problems of controlling a leaking hazardous gas material into the air of gas cabinet in the semiconductor manufacturing facility. In such gas cabinets, gross leakages of gas may result in flows of hazardous gaseous compounds which may be as high as 700-1500 cubic feet per minute (CFM). At the gas flow velocities associated with such high flow rates, it is very difficult to design efficient gas scrubbers, and the units that have been employed are very large and very costly.

The reason for this is that any sorbent bed that is employed to remove or convert a component in a gas stream requires a finite contact time to carry out its task. The process parameter that characterizes such contact time is the critical space velocity (CSV), which is expressed in units of volume of gas per volume of bed per hour. This parameter thus measures the maximum volume of gas that can be passed through a unit volume of bed per hour with a removal or conversion which is complete, to the detection limit of the user. If gas flow through the sorbent bed is pushed to a space velocity higher than the CSV, there will be leakage of the undesirable constituent which is sought to be sorbed in the scrubber bed. Accordingly, to contain the sorbent material in the bed within allowable limits below the CSV, even in the event of a gross gas leakage of the hazardous constituent, the sorbent bed must be very large in volume, and substantially in excess of the sorbent volume required for normal operation hazardous gas constituent levels in the stream being sorptively treated by the bed.

In addition to the foregoing, if the gas cylinder leakage involves a pyrophoric gas such as silane, there is the potential for fire and/or for explosion, and consequent injury and/or damage in the semiconductor facility. If a large enough excursion of the pyrophoric gas occurs, substantial portions of the semiconductor facility could be put at risk or even destroyed.

It would therefore be a substantial advance in the art to provide a system for the total containment and treatment of hazardous gases, with removal being achieved via efficient sorbent compositions and gas scrubber apparatus, particularly in the event of sudden large volume leakages of the hazardous gas.

Accordingly, it is an object of the present invention to provide improved apparatus, sorbent compositions, and processes for containing and treating gross leakages of hazardous gases, e.g., from high pressure gas cylinders or other large volume sources of such gases.

It is a further object of the present invention to provide such apparatus, sorbent compositions, and processes in the form of containment/treatment systems which are relatively compact in character and easily manufactured and readily used. Other objects and advantages of the present invention will be more fully apparent from the ensuing disclosure and appended claims.

SUMMARY OF THE INVENTION

The present invention in one aspect relates to a sorbent composition including an initial contact sorbent comprising a hygroscopic aluminosilicate sorbent, e.g., a dry molecular sieve material, and a subsequent contact sorbent comprising an aluminosilicate sorbent impregnated with an aqueous base solution.

The present invention in another aspect relates to a multizone gas purifier composition embodying a serial (a), (b), (c) arrangement of sorbent beds, including:
a first sorbent bed (a) comprising a hygroscopic aluminosilicate sorbent;
a second sorbent bed (b) comprising an aluminosilicate sorbent impregnated with an aqueous base solution; and
a third sorbent bed (c) comprising a support having associated therewith, or covalently bonded thereto, organometallic compound(s) selected from the group consisting of compounds of the formulae:

$$RM. \qquad (i)$$

wherein:
R is alkyl; and
M is selected from the group consisting of lithium, sodium, and potassium;

$$R_{2-a}M_2X_a \qquad (ii)$$

wherein:
R is alkyl;
M is selected from the group consisting of magnesium and zinc;
X is halide; and
a is a number between 0 and 1, inclusive;

$$R_{3-b}AlX_b \qquad (iii)$$

wherein:
R is alkyl;
X is halide; and
b is a number between 0 and 2, inclusive.

Preferably the sorbent beds in such arrangement are vertically aligned with one another and with bed (a) at the top, bed (b) in the middle, and bed (c) at the bottom. Optionally, this purifier composition may comprise a suitable oxidizing agent, such as potassium permanganate ($KMnO_4$), following sorbent (c).

Another aspect of the invention relates to a gas supply and containment assembly, comprising:
(a) a gas cabinet defining an interior volume and including cabinet flow circuitry coupleable to a gas cylinder positionable therein for flowing source gas from the gas cylinder through the flow circuitry in selected modes of flow including discharging of the source gas for use exterior of the gas cabinet;
(b) an outer enclosure containing:
(1) the gas cabinet;
(2) a scrubber unit including a sorbent material which is sorptively selective for the source gas; and
(3) enclosure flow circuitry (A) coupleable to a source of inert gas, for flowing inert gas into the gas cabinet, and (B) coupled to the scrubber, for flowing gas from the interior volume of the gas cabinet to the scrubber, and for discharging effluent gas from the scrubber to a locus exterior of the outer enclosure.

A further aspect of the invention relates to a switchable multitank gas sorption system, comprising:
a first sorbent vessel containing selective sorbent material;
a second sorbent vessel containing selective sorbent material;
gas flow circuitry joined to the first and second sorbent vessels and connectable to a source gas supply means for introducing source gas to a selected one of the first and second sorbent vessels and for discharging from said selective one sorbent vessel an effluent gas depleted in constituent(s) which are sorbable by the selective sorbent in said selected one vessel, said gas flow circuitry comprising:
(1) a feed manifold (2) a source gas feed conduit joinable at one end thereof to a source gas supply means and joined at an other end thereof to the feed manifold;

(3) a first inlet conduit joined at one to the feed manifold and at an other end to the first sorbent vessel;

(4) a second inlet conduit joined at one end to the feed manifold and at an other end to the second sorbent vessel, wherein the first and second inlet conduits are in spaced-apart relationship to one another, and in spaced relationship to the source gas feed conduit;

(5) a first flow control valve in the feed manifold between the source gas feed conduit and the first inlet conduit;

(6) a second flow control valve in the feed manifold between the source gas feed conduit and the second inlet conduit;

(7) an outlet manifold;

(8) a first discharge conduit joined at one end to the first sorbent vessel, in spaced relationship to the first inlet conduit, and joined at an other end to the outlet manifold;

(9) a third flow control valve in the first discharge conduit;

(10) a second discharge conduit joined at one end thereof to the second sorbent vessel in spaced relationship to the second inlet conduit, and joined at an other end thereof to the outlet manifold, in spaced relationship to the first discharge conduit; and

(11) a fourth flow control valve in the second discharge conduit;

an end point sensor in the outlet manifold which is operative to detect a condition indicative of exhaustion of capacity of a selected one of the first and second sorbent vessels through which source gas is flowed for sorption of selectively sorbable constituent(s) therefrom; and control means responsive to the end point sensor for selectively adjusting the first, second, third, and fourth flow control valves such that the flow of source gas is initially directed through a selected one of the first and second sorbent vessels and upon end point sensing by the end point sensor switching the first, second, third, and fourth flow control valves so that the flow of source gas is switched from said selected one of the first and second beds to the other of said first and second sorbent beds, for sorption of selectively sorbable constituent(s) therefrom in the other said sorbent vessel.

Another aspect of the present invention relates to a gas containment and treatment system, comprising:

(a) a gas cabinet/enclosure assembly of the type broadly described hereinabove;

(b) a vacuum sump vessel joined in selectively establishable flow communication with the gas cabinet/enclosure assembly;

(c) a gas scrubbing unit joined in selectively establishable flow communication with the vacuum sump vessel;

(d) means for maintaining a pressure level in the vacuum sump vessel sufficient to cause flow of gas from the gas cabinet/enclosure assembly to the sump vessel when flow communication is selectively established therebetween; and (e) control means for selectively establishing the extent of the flow communication between the gas cabinet/enclosure assembly and the vacuum sump vessel, and between the vacuum sump vessel and the gas scrubbing unit.

Another aspect of the invention relates to a method of treating a gaseous stream to remove therefrom impurities comprising (1) a tungsten halide compound and (2) a silane component selected from the group consisting of silanes, halosilanes, and mixtures thereof, by steps including:

providing a sorbent composition of a type broadly described hereinabove;

flowing the gaseous stream through such sorbent composition; and recovering an effluent gas of reduced impurity content.

Another method aspect of the invention relates to a method of containing and treating a source gas from a pressurized gas cylinder, comprising:

providing a gas containment and treatment system as broadly described above;

flowing an inert gas into the gas cabinet of the gas cabinet/enclosure assembly;

flowing inert gas from the gas cabinet interior volume to the scrubber unit in the gas cabinet/enclosure assembly; and in the event of a bulk gas leak of source gas in the gas cabinet, flowing gas from the gas cabinet interior volume to the vacuum sump vessel and flowing gas from the vacuum sump vessel to the scrubber unit, e.g., a switchable multi-tank gas sorption system as described above.

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
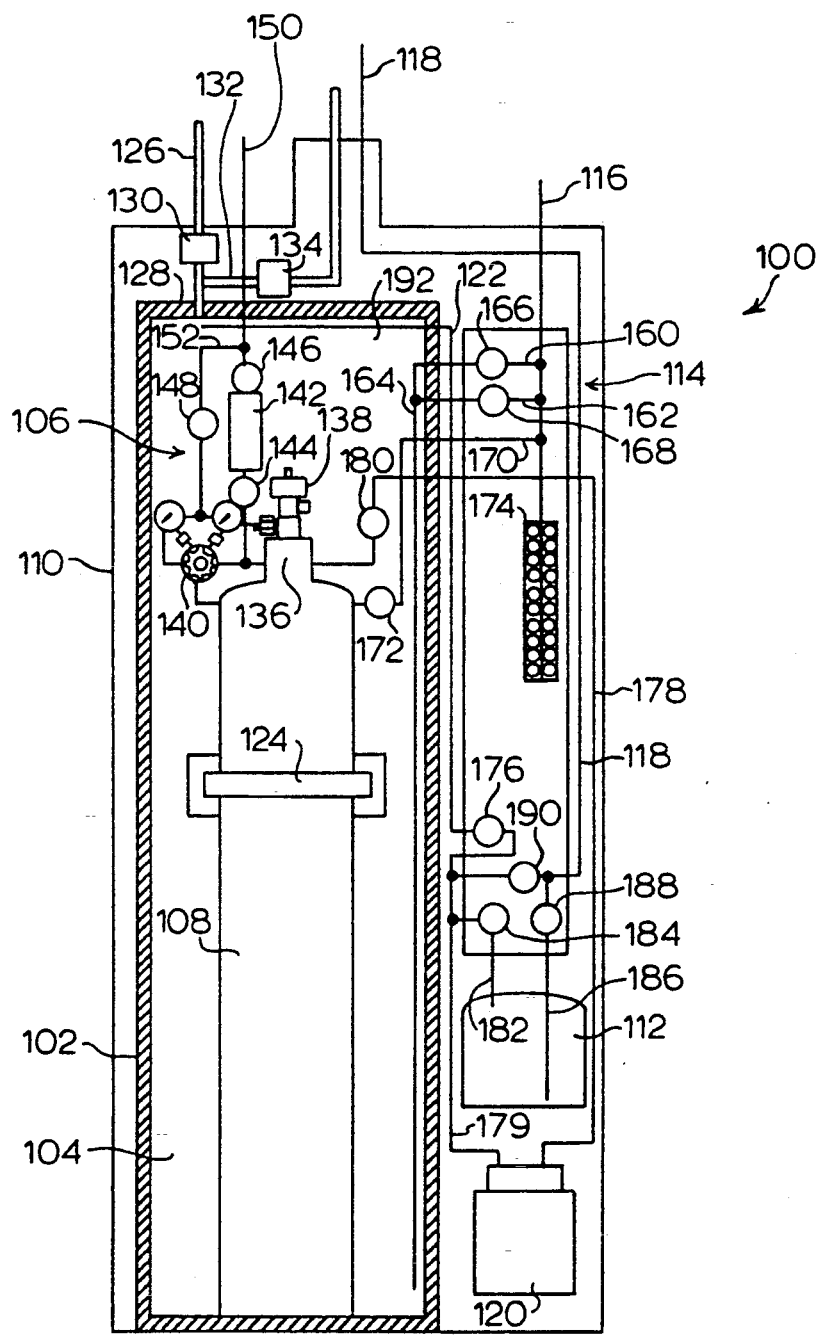
FIG. 1 is a schematic front elevation view of a gas supply and containment assembly according to one embodiment of the present invention.

The sorbent materials which may potentially be usefully employed in the broad practice of the present invention, as variously described hereinafter, may be of any suitable composition appropriate to the species of hazardous gases which must be contained and treated (sorptively removed) in the specific end use application being considered. Such hazardous gases may for example comprise Group II-VII gases or gas mixtures comprising same. Such gases and gas mixtures, as indicated, are typically employed in semiconductor manufacturing operations. As used in this context, the term "Group II-VII constituents" refers to gases deriving from volatile compounds containing Group II-VII elements of the Periodic Table, as well as to the Group II-VII elements themselves. Illustrative examples include gaseous alkyl compounds, e.g., dimethylarsine, t-butylarsine, etc., in which at least one hydrogen atom is bound to the metal atom. The specific sorbent compositions useful in Group II-VII constituent removal will of course depend on the specific constituents to be removed, and the TLV and other effluent criteria for the specific process system which is considered.

The reaction mechanisms which are usefully applied in the sorption of Group II-VII constituents in the broad practice of the present invention, utilizing the sorbent materials hereinafter more fully described, include nucelophilic substitution, deprotonation, and chemical oxidation, the latter being useful primarily as a final stage processing reaction to insure that residual concentrations of the Group II-VII constituents in the final effluent from the process system are reduced to extremely low levels. Each of these three forms of reactive removal of Group II-VII constituents is discussed in turn below.

Nucleophilic substitution reactions may be carried out utilizing the sorbent compositions more fully described in prior copending application Ser. No. 295,419 filed Jan. 10, 1989, the disclosure of which hereby is incorporated herein by reference. Nucleophilic substitution reactions involve the formation of adducts by metals and electron donating (nucleophilic) compounds, in the gas contacting system in which the process gas is contacted with the sorbent material.

The sorbent compositions which may be usefully employed to carry out such nucleophilic substitution reactions to remove Group II-VII constituents of gases and gas mixtures comprising same, may suitably comprise a support having associated therewith, or covalently bonded thereto, metal moieties such as lithium, potassium, sodium, magnesium, and/or zinc, in a functional form which is reactive to form the adduct by reaction with the Group II-VII constituent. A preferred sorbent composition for such purpose, which has particular utility for removing Group II alkyl compounds, Group III alkyl compounds, and Group IV compounds, comprises polyvinyl phenoxy metal compounds, such as polyvinyl phenoxy lithium, on a suitable support. Lithium is a preferred sorbent material metal constituent for such purpose, although other alkali metals, as well as alkaline earth metals, may potentially be useful. It is to be recognized that other lithoxy sorbent compounds may also be potentially useful in such application. Such lithoxy compounds may suitably include compounds of the formula LiOR', wherein R' is a polymeric backbone, or other chemical moiety imparting to the sorbent material the ability to form an adduct with the gas constituent having a suitably low vapor pressure, preferably substantially less than one part per million (ppm).

Utilizing lithium sorbent compositions of the formula LiOR' as examples, the nucleophilic substitution adduct formation reactions, for illustrative trialkylaluminum and silane waste gas constituents, are as follows:

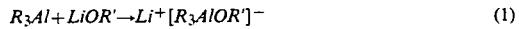

$$R_3Al + LiOR' \rightarrow Li^+[R_3AlOR']^- \qquad (1)$$

$$SiH_4 + LiOR' \rightarrow SiH_3OR' + LiH \qquad (2)$$

If the OR' group in the lithoxy scavenger is polymeric, such as the preferred polyvinyl phenoxy moiety, the vapor pressures of the respective aluminum and silicon adducts will be effectively zero.

When employing the above-described sorbent material compositions to effect nucleophilic substitution reactions and form adducts from the gas constituents, it is important, from the standpoint of maximizing the effective use of the sorbent material, to employ the sorbent material in beds of appropriate size. Such beds typically are provided in a containment vessel which is equipped with respective inlet and outlet ports, by which the gas or gas mixture is introduced to the bed and hazardous constituent-depleted gas is discharged from the bed, respectively.

In order to provide beds of sorbent material for gas contacting which are of appropriate size, the beds must be designed so that their critical space velocity is within appropriate limits. As used herein after, "critical space velocity" (CSV) is the ratio at which the volumetric flow rate of the gas mixture contacted with the sorbent material volume becomes too high to effect removal of the impurities at a selected minimum leakage (substantially zero) level.

For the aforementioned sorbent material compositions which effect nucleophilic substitution reactions resulting in adduct formation to remove the hazardous gas constituents, the CSV of the sorbent bed must be greater than about 1,000 volumes of gas per volume of bed per hour. Adherence to this design criterion will insure that the sorbent beds are not excessively sized.

Another class of sorbent compositions suitable in the broad practice of the present invention comprises active sorbent species which effect removal of Group II-VII constituents from gases containing same, by deprotonating the undesired compounds, yielding low vapor pressure reaction products comprising the deprotonated constituents Strong bases may be employed as the sorbent, as source compounds for carbanions for deprotonating the specific Group II-VII constituent(s) sought to be removed.

Sorbent compositions of such type may suitably comprise a support having associated therewith, or covalently bonded thereto, organometallic compound(s) selected from the group consisting of compounds of the formulae:

$$RM, \quad (i)$$

wherein:
R is alkyl; and
M is selected from the group consisting of lithium, sodium, and potassium;

$$R_{2-a}M_2X_a, \quad (ii)$$

wherein:
R is alkyl;
M is selected from the group consisting of magnesium and zinc;
X is halide; and
a is an number between 0 and 1, inclusive;

$$R_{3-b}AlX_b, \quad (iii)$$

wherein:
R is alkyl;
X is halide; and
b is a number between 0 and 1, inclusive.

A preferred class of carbanion source compounds includes organometallic compounds such as alkyllithium, alkylsodium, alkylpotassium, dialkylmagnesium, alkylmagnesium halide, dialkylzinc, alkylzinc halide, trialkylaluminum, dialkylaluminum halide, and alkylaluminum dihalide, wherein the alkyl radial contains 1-12, and preferably 1-8, carbon atoms. Particularly preferred organometallic compounds for such purpose are dibutylmagnesium and butyllithium.

Alkyl or dialkyl metal compounds are a most preferred class, although other metal-containing carbanion source compounds may be employed, of the formula MA, where M is a metal moiety such as lithium, sodium, potassium, alkylmagnesium, or alkylzinc; and A is a carbanion. In practice, butyl carbanions have been employed to good effect, and are preferred alkyl carbanion constituents.

Table I below shows $pK_a$ deprotonation equilibrium constants ($K_{eq}$) for selected compounds, to illustrate the selection criteria for the carbanion species and carbanion source compounds which may be usefully employed in sorbent compositions, to effect removal of Group II-VII constituents by deprotonation reactions.

TABLE I

| Compound | $pK_a$[1,2] | $logK_{eq}$[3] |
|---|---|---|
| Bu—H | 42 | 0 |
| Me—H | 40 | 2 |
| H—H | 37 | 5 |
| C$_6$H$_5$—H | 37 | 5 |
| NH$_2$—H | 37 | 5 |

TABLE I-continued

| Compound | $pK_a$[1,2] | $logK_{eq}$[3] |
|---|---|---|
| PH$_2$—H | 28 | 14 |
| AsH$_2$—H | 26 | 16 |
| HO—H | 15 | 27 |
| H—F | 3 | 39 |
| RSO$_3$—H | −7 | 49 |
| H—Cl | −7 | 49 |
| H—I | −10 | 52 |

[1] K. Isslieb and R. Kummel, "Alkali-Phosphorverbindungen un ihr Reaktives verhalten XXX. Zur P—H—und As—H—Aciditat Primarer und Sekundarer Phosphine bzw. Arsine," J. Organomet. Chem. 3, 84-91 1965.
[2] A. J. Gordon and R. A. Ford, "The Chemist's Companion," John Wiley & Sons, New York, pp. 62-63 (1972).
[3] Measured between the butane and second chemical species' $pK_a$.

The $pK_a$ value is the negative logarithm of the acidity constant of a given material, so that increasing values of $pK_a$ indicate increasing basicity. As used herein, the $pK_a$ value of a compound refers to $pK_a$ numerical value determined in accordance with the procedure described in A. Streitwieser and J. H. Hammons, Prog. Phys. Org. Chem., 3, 41 (1965), in a solvent medium in which fluorene and diphenylmethane, as reference compounds, have $pK_a$ values of about 22.6 and 34.1, respectively.

With reference to the compounds illustratively tabulated in Table I, the deprotonation reaction will be kinetically fast for those species having log $K_{eq}$ values in the range of 10 and above. Accordingly, the deprotonation reactions will be kinetically fast for those species from phosphine (PH$_3$) and below in Table I.

As indicated, a preferred carbanion source compound is butyllithium (LiBu). Using this source compound as an illustrative sorbent material species, the deprotonation reactions can be effectively carried out for Group V hydride compounds such as arsine and phosphine (but less effectively with ammonia), as well as for Group VI and Group VII compounds, including hydrides of sulfur, selenium, and tellurium, and hydrogen halides whose halo moiety is chlorine, bromine, iodine, fluorine.

Typical deprotonation reactions for the foregoing groups are exemplified below, for butyllithium as well as dibutyl magnesium.

$$LiBu + AsH_3 \rightarrow Li(AsH_2) + BuH \rightarrow Li_3As \quad (3)$$

$$LiBu + H_2Se \rightarrow LiSeH + BuH \rightarrow Li_2Se + H_2 \quad (4)$$

$$LiBu + HCl \rightarrow LiCl + BuH \quad (5)$$

$$Bu_2Mg + 2AsH_3 \rightarrow Mg(AsH_2)_2 + 2BuH \rightarrow Mg_3As_2 \quad (6)$$

$$Bu_2Mg + 2H_2Se \rightarrow Mg(SeH)_2 + 2BuH \rightarrow MgSe + H_2 \quad (7)$$

$$Bu_2Mg + HCl \rightarrow MgCl_2 + 2BuH \quad (8)$$

wherein Bu is butyl.

As shown by the foregoing reactions, the deprotonized impurity species in each of the above reactions is ultimately bound to the metal cation in the reaction product. Such reaction products have negligible vapor pressure. Accordingly, the gas mixture contacted with the sorbent material in such deprotonation reactions will produce a gaseous effluent which is substantially completely depleted in the Group V-VII constituent.

As mentioned above, the deprotonation reaction of ammonia with the sorbent compound dibutylmagnesium does not achieve a high removal of the hazardous gas constituent, relative to the removal levels which are achieved by such sorbent compound with respect to the other hydrides of Group V (viz., phosphorus and arsenic hydrides), or to Group V hydrides or to Group VII hydrogen halides.

In the case of ammonia as the gas constituent to be removed, it is advantageous to utilize as the active sorbent material a strong acid. The use of suitable strong acids is likewise advantageous for other basic impurity constituents in the gas stream. Sulfonic acids are particularly preferred as active sorbent species for removal of ammonia from gases comprising same. The equilibrium constant, $K_{eq}$, for this reaction, by which gaseous ammonia is reacted with the sulfonic acid sorbent species to form a quaternary ammonia complex, $$NH_3 + RSO_3H \rightarrow RSO_3^- NH_4^+ \qquad (9)$$

wherein R is a monovalent radical or other anchoring moiety such as a polymeric backbone structure, is about $10^{17}$. As a result of this high equilibrium constant for the reaction, ammonia will be effectively and substantially completely stripped from the gas contacted with the sulfonic acid active sorbent component.

With regard to the removal of Group II–VII constituents of gases and gas mixtures comprising same, by flowing the gas through a bed of the scavenger material to effect deprotonation reactions, the critical space velocity of the scavenger bed should be greater than 1,000 volumes of gas mixture per volume of scavenger bed per hour, to properly size the scavenger bed and avoid a bed of excessive size.

Impurity removal of Group II–VII constituents of gases and gas mixtures comprising same, also may be carried out by chemical oxidation reactions, with the exception of some of the Group VII acids. Among the oxidizing materials which may advantageously be employed as active sorbent materials are lead oxide ($PbO_2$) and alkali metal permanganates of the formula $MMnO_4$, wherein M is an alkali metal.

A preferred oxidizing sorbent is potassium permanganate, $KMnO_4$. This sorbent material compound effects a kinetically fast oxidation reaction with the Group II–VII compounds generally encountered in semiconductor manufacturing operations, with the aforementioned exception of certain Group VII acids. Due to its high oxidation potential, potassium permanganate is thermodynamically capable of efficient removal of the aforementioned hazardous gases, but it has a low capacity, and, as indicated herein earlier, entails the potential risk of explosive reactions. Accordingly, the potassium permanganate sorbent preferably is employed in final stage of a multi-stage sorbent composition, wherein upstream treatment of the Group II–VII constituent(s) of the gas stream is carried out utilizing nucleophilic substitution and/or deprotonation scavenging reactions.

As a final treatment, oxidation with potassium permanganate may be employed to effect removal of the hazardous gaseous materials that escape sorption in the upstream treatment steps, providing a high rate of reaction to achieve substantially complete removal of these undesired constituents. Inasmuch as it is employed downstream of the main sorptive removal treatment, the explosion hazard will be correspondingly reduced because the concentrations of the toxic gaseous components will be low.

From a design standpoint, the sorbent bed of potassium permanganate or other alkali metal permanganate sorbent should be at least 1,000 volumes of gas per volume of bed per hour, in order to provide appropriately sized sorbent beds.

The aforementioned active sorbent materials are suitably associated with, or covalently or ionically bonded to, support substrate materials to form the sorbent compositions useful in the practice of the present invention. if the active sorbent species is not covalently or ionically bonded to the support substrate, it may be associated with the support in any suitable manner. For example, the active sorptive species may be dispersed throughout the support matrix in the form of particulates or aggolomerates, as a film or plating on the support, or otherwise localized in pores of a porous support. The specific choice of support material, and the form of the active sorbent species and its method of disposition on the substrate, may be varied widely depending on the specific active sorptive species and support materials employed.

The supports useful in the sorbent compositions in the broad practice of the present invention include any suitable materials which are compatible with the gas streams being treated, and the reaction products of the sorption removal process, and any intermediates involved with conditioning or otherwise preparing the sorbent composition, and which are stable under the conditions of use. The support should have sufficiently high temperature and chemical stability and porosity characteristics. The stability criteria are important for maintaining the integrity of the sorbent composition during the pyrolysis phase of synthesis operations and with the reagents utilized during the synthesis and in the gas stream of interest. The maximum temperatures that are likely to be encountered are in the range of 200° C. to 300° C. The reagents employed in the synthesis operation are likely to be strongly reducing in character. The support typically must be stable to both strongly acidic and strongly basic reagents.

Illustrative support materials which may be potentially useful in sorbent compositions in the broad practice of the invention include materials such as aluminosilicates, alumina, silica, kieselguhr, activated carbon, metal fluorides, and "aluminosilicates" means a support composition including the fluorocarbon polymers. As used herein, the term elements aluminum, silicon, and oxygen, such as molecular sieves; and such aluminosilicates may be natural or synthetic in character.

The preferred characteristics of supports which are useful for sorbent compositions in the broad practice of the invention include (a) high surface area, for example a surface area in the range of from about 50 to about 1000 square meters per gram of support, (b) high porosity, such as a significant porosity from pores of a diameter in the range of from about 3 to about 200 Angstroms, and (c) good thermal stability, e.g., thermally stable at temperatures up to about 250° C., and preferably to about 300° C.

The sorbent materials employed in the broad practice of the inventions may be readily formed into a bed through which gas is flowed, thereby providing a highly efficient removal system for substantially eliminating Group II–VII gaseous constituents.

The capacity of the sorbent bed for removing Group II-VII gases may of course be readily adjusted to a particular desired level by controlling the loading of the active sorptive moiety on the support, in the impregnation or other fabrication step by which the active sorptive species is applied to the support.

Preferred supports for sorbents in the broad practice of the invention include aluminas, silicas, molecular sieves, and other aluminosilicates.

There is a special requirements for the support material when hydrogen fluoride or hydrogen fluoride-producing gas streams are being treated. In such case, common metal oxides are attached by the hydrogen fluoride and undergo severe hydrolysis. Accordingly, in such gas treatment environment, the support suitably is varied from the otherwise preferred support materials; in these applications, metal fluorides or porous fluorinated polymers such as polytetrafluoroethylene (PTFE) are advantageously employed as the support materials.

Set out below is an illustrative listing of preferred sorbent compositions for selected Group II-VII gaseous compounds which frequently are employed or otherwise present in process gas streams in semiconductor manufacturing plant operations.

Group II Alkyl Compounds

Group II alkyl compounds can be removed from gases comprising same by a sorbent composition comprising polyvinylphenoxylithium as the active sorptive species, on an alumina support. Such preferred sorbent composition may optionally be employed in combination with a further secondary treatment sorbent composition, comprising potassium permanganate as the active scavenging species, on an alumina support. In general, however, it is unnecessary to employ such final potassium permanganate sorbent, if the polyvinylphenoxylithium sorbent is provided in sufficient quantity in an appropriately sized bed.

Group II Alkyl Compounds

A preferred sorbent composition for Group III alkyl compound removal from gases comprising same, includes polyvinylphenoxylithium as the active sorptive species, on an alumina support.

Group IV Compounds

The preferred sorbent composition for this class of compounds comprises polyvinylphenoxylithium as the active sorptive species on an alumina support. This sorbent is particularly useful for reducing the concentration of silane and chlorinated silane gases to very low final effluent levels.

Group V Hydrides

Arsine, phosphine, alkylarsine, and alkylphosphine gaseous constituents are effectively removed by a dibutylmagnesium active sorptive species on an alumina support. Such a sorbent composition is capable of reducing arsine concentration to a final effluent concentration on the order of about 200 parts per million. If desirable, the use of a further sorbent treatment utilizing potassium permanganate as the active sorptive species on an alumina support effectively reduces the residual arsine concentration in the final effluent gas to less than TLV, 0.05 parts per million.

Ammonia may effectively be removed from gases comprising same by non-volatile acid groups such as sulfonic acid groups, which preferably are provided as pendant groups on a suitable polymeric support matrix. Alternatively, the sorptive acid groups may be supported on a suitable inert support such as alumina. A suitable sorbent composition for such purpose includes as a support a polystyrene-divinylbenzene resin, with the sulfonic acid constituent comprising sulfonic acid or sulfonate anion radicals, as substituents on aromatic rings of the polystyrene-divinylbenzene resin. In general the $pK_a$ value of the active scavenging species (acid groups) should be less than about 1, to achieve a reasonably complete removal of ammonia from the gas stream by the following reaction $$HY + NH_3 \rightarrow NH_4^+ Y^- \tag{10}$$

Group VI Compounds

The hydridic compounds of the Group VI elements, viz., hydrogen sulfide, hydrogen selenide, and hydrogen telluride, are effectively completely removed from gases comprising same, via contacting with the dibutylmagnesium active sorptive species, on an alumina support.

Group VII Compounds

Hydrogen halides (the halo moiety of which is fluorine, chlorine, bromine, or iodine) are effectively removed from gases containing same, by contact of the gas with dibutylmagnesium as the active sorptive species. For hydrogen halides wherein the halo moiety is chlorine, bromine, or iodine, a preferred support material is alumina, while in applications requiring removal of hydrogen fluoride, the support preferably is a material such as calcium fluoride ($CaF_2$).

Although the foregoing description has been directed primarily to sorptive removal of Group II-VII constituents, it will be appreciated that the utility of the invention is not thus limited, but rather extends to a wide variety of sorbable gases of diverse character, depending on the character and availability of suitable sorbent compositions for sorptive removal thereof from gas streams or volumes containing same. In this respect, the term "sorbent" and "sorptive" refer to compositions and processes involving chemisorption, physical adsorption, and/or any other method by means of which the gaseous constituents can be removed by association or combination with a material having affinity therefor. In general, however, the hazardous character of gases to which the invention is best applicable require chemisorption to secure removal levels which are consistent with safety, toxicity, and environmental considerations.

Referring now to FIG. 1, there is shown a front elevational view of a gas supply and containment assembly 100 comprising an inner gas cabinet 102 defining an interior volume 104 and including cabinet flow circuitry 106 which is coupleable to a gas cylinder 108 positioned in the gas cabinet. The cabinet flow circuitry 106 is provided for flowing a source gas, e.g., arsine, from the gas cylinder 108 through the flow circuitry in selected modes of flow, as described more fully hereinafter, including discharging of the source gas for use exterior of the gas cabinet.

The gas supply and containment assembly 100 further includes an outer enclosure (outer gas cabinet) 110 containing the (inner) gas cabinet 102 as well as a scrubber unit 112 including a sorbent material therein which is selective for the source gas constituent. For the illustrative arsine source gas, the sorbent material in scrubber 112 may comprise butyllithium as the active sorptive (scavenging) species, on an alumina support.

The outer enclosure 110 also contains enclosure flow circuitry 114, which is (A) coupleable to a source of inert gas (not shown) via the inert gas feed line 116, for flowing inert gas into the gas cabinet 102 and (B) coupled to the scrubber 112, for flowing gas from the interior volume 104 of the gas cabinet to the scrubber, and for discharging gas of reduced source gas e.g., (arsine) content from the scrubber to a locus exterior of the outer enclosure 110, via scrubbed gas effluent line 118.

The outer enclosure 110 further contains a pump 120 coupled to the outer enclosure flow circuitry 114 for withdrawing gas from the interior volume 104 of the gas cabinet, via gas cabinet withdrawal line 122, by means of which the gas from the interior volume of the gas cabinet is passed to the scrubber unit 112, and thereafter is discharged in scrubbed gas effluent line 118.

The high pressure gas cylinder 108 in the gas cabinet 102 may be of any suitable type, as for example a 200 liter gas cylinder containing source gas at 2000 psig. The gas cylinder may be held in position in the gas cabinet by a cylinder clamp 124 or other suitable securement means.

An exhaust gas conduit 126 passes through the upper wall 128 of the gas cabinet and communicates with the interior volume 104 therein. The exhaust gas conduit 126 has an automatic valve 130 disposed therein, to controllably adjust the flow therethrough, from a fully closed to a fully opened position. The exhaust gas conduit 126 communicates with branch line 132 having automatic value 134 disposed therein. The purpose of automatic valve 134 is to carry out the rapid purge of the inner container space. This effluent is presumably clean so that it is not scrubbed and dumped into the duct works.

Joined to the valve head 136 of the high pressure gas cylinder 108 is an actuated cylinder valve 138, e.g., a actuated Martin Technology Series 2020 cylinder valve having a valve coefficient of 0.188, as commercially available from Martin Technology (Middlebury, Conn.). The gas cabinet circuitry 106 joined to the valve head and actuated cylinder valve 138 includes a pressure regulator 140 and a gas purifier 142. The gas purifier is an optional feature of the process system, and may be of a type as more fully described in copending U.S. application Ser. No. 07/295,419 filed Jan. 10, 1989, as specifically shown and described with reference to FIG. 2 therein, or of a type as shown and described in U.S. Pat. No. 4,761,395.

The gas cabinet circuitry 106 further comprises automatic flow control valves 144, 146, and 148. The gas cabinet flow circuitry includes a process gas discharge line 150 extending through the top wall 128 of the gas cabinet, in which is disposed the aforementioned gas purifier 142 and flow control valves 144 and 146, with a branch gas discharge conduit 152 interposed between the pressure regulator 140 and process gas discharge line 150, with the branch conduit having a flow control valve 148 disposed therein.

The inert gas feed line 116 is joined in the outer enclosure 110 to branch lines 160 and 162. These branch lines are in turn joined to gas cabinet feed line 164, which terminates in the lower end of the gas cabinet. The branch lines 160 and 162 are provided with automatic flow control valves 166 and 168 therein, respectively.

Inert gas feed line 116 is also joined in the outer enclosure 110 to purge branch line 170 having flow control valve 172 therein. The purge branch line is joined at its other end to pressure regulator 140. Joined to the lower end of inert gas feed line 116 is a solenoid block 174.

Interior volume gas withdrawal line 122 has an end disposed in the upper portion of the gas cabinet 102. This line passes through the wall of the gas cabinet and downwardly in the outer enclosure to pump 120, and is provided with flow control valve 176 therein. The pump is joined to an inlet line 178 which passes into the interior volume of the gas cabinet, and an outlet line 179, as shown. The inlet line 178 is provided with flow control valve 180 therein, and is joined to product discharge line 150 and optionally to branch line 152, thereby providing a bypass loop around gas purifier 142.

The scrubber 112 in the outer enclosure has a feed line 182 extending from the interior volume gas withdrawal line 122 to an upper portion of the scrubber vessel. The feed line 182 is provided with flow control valve 184 therein. The scrubber 112 also is joined to a discharge line 186, having flow control valve 188 therein. The discharge line constitutes a bypass loop around the scrubber, and is joined at its opposite end to the exhaust line 118 having flow control valve 190 therein.

Figure 2:
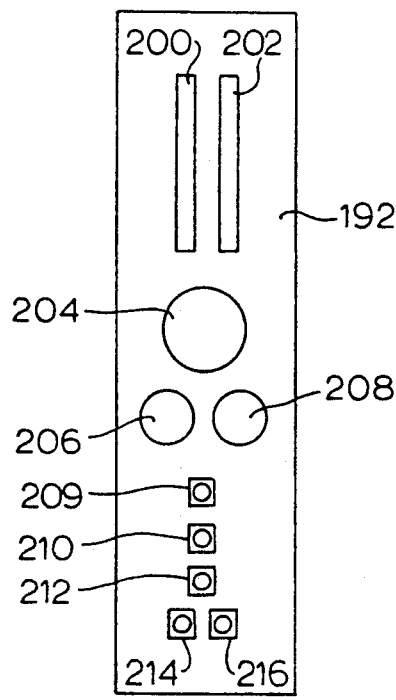
FIG. 2 is a schematic elevation view of a control panel which may be utilized in the gas supply and containment assembly of FIG. 1.
Figure 3:
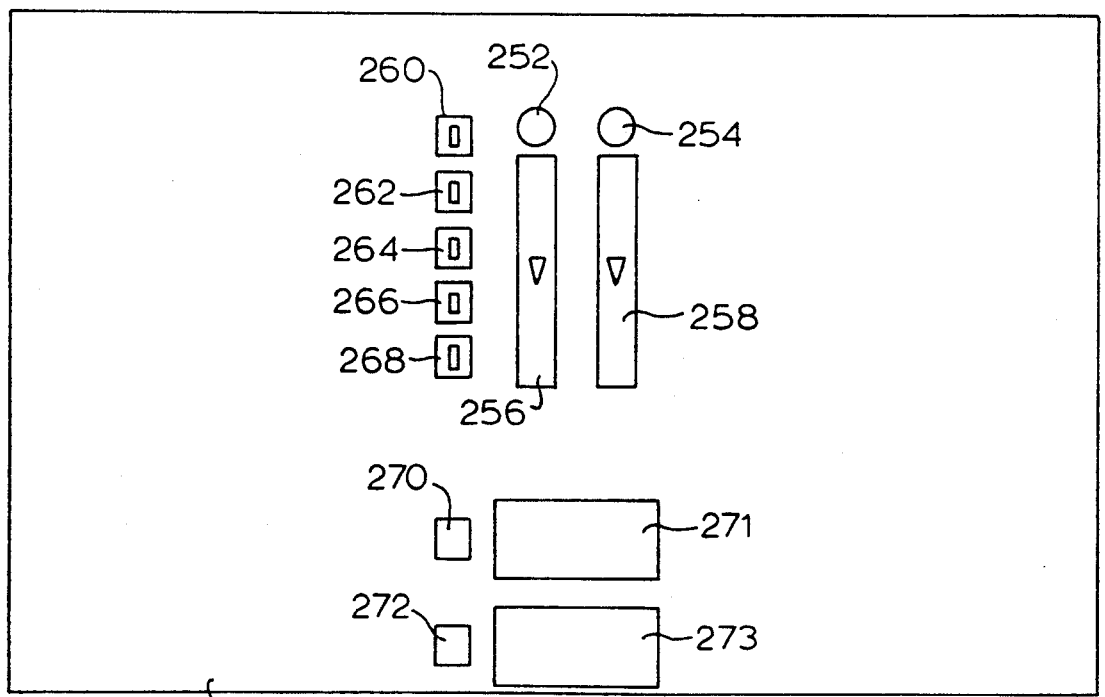
FIG. 3 is a schematic elevation view of another embodiment of a control panel which may be employed in the gas supply and containment assembly of FIG. 1.

The outer enclosure of the gas supply and containment assembly shown in FIG. 1 is equipped with a control panel 192, the exterior face of which may be configured as shown in FIG. 2, with an alternative control panel embodiment being shown in FIG. 3.

Referring to FIG. 2, the control panel 192 controls the gas cabinet and comprises a panel with control and output devices including a rotameter 200 for flow control valve 166 in FIG. 1, and a rotameter 202 for flow control valve 168 as shown in FIG. 1. In the intermediate portion of the control panel is a photohelic or other suitable type controller 204, e.g., an electronic pressure controller below, which is a pressure gauge 206 indicating pressure in the vacuum sumps, as more fully described hereinafter in connection with FIGS. 6 and 7 hereof, and a back pressure gauge 208.

On the lower portion of the control panel 192 is an on/off switch 209, a gas cabinet open/close controller 210, a pressure vent gas selector switch 212, a pressure/-vent selector switch 214, and a nitrogen/hazardous gas controller 216.

FIG. 3 shows another control panel 250 which may usefully be employed in the FIG. 1 gas supply and containment assembly to control the scrubber unit. The control panel of FIG. 3 comprises a purge nitrogen valve 252, and dilution nitrogen valve 254, below which is a purge nitrogen rotameter 256 and a dilution nitrogen rotameter 258. To the left of such features is a main power switch 260, an A/B switch 262, an "Operate" switch 264, and respective nitrogen purge and nitrogen dilution switches 266 and 268.

At the lower portion of panel 250 there is provided a high pressure alarm 270 and an end point alarm 272, with corresponding indicating gauges 271 and 273, respectively.

Figure 4:
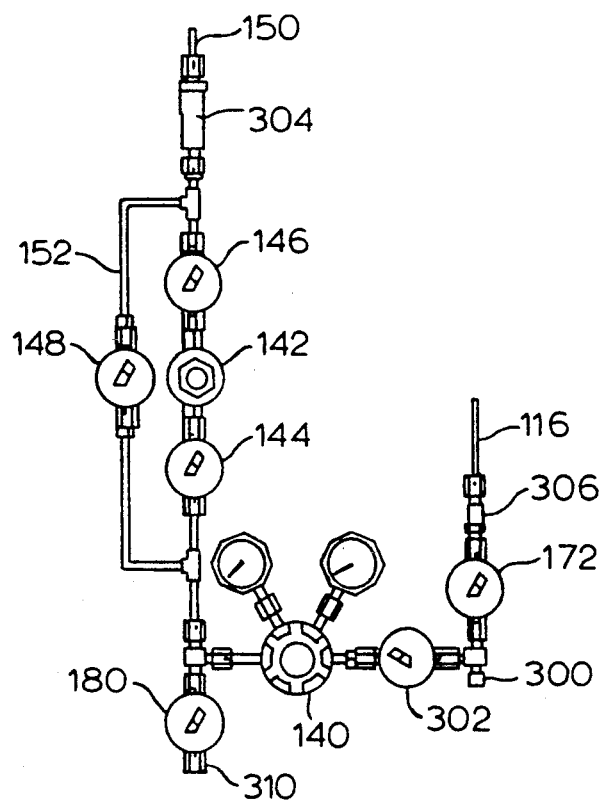
FIG. 4 is an elevation view of flow circuitry associated with the gas supply and containment assembly of FIG. 1.

FIG. 4 is a front elevation view of a portion of an illustrative gas cabinet circuitry of the type shown schematically in FIG. 1, and wherein the same parts and features are numbered correspondingly with respect to FIG. 1. It will be appreciated that the flow circuitry layout shown in FIG. 4 is shown by way of example only, and that the exact configuration of the flow circuitry may be varied, using various permutations of the piping and flow elements shown in FIG. 4. As shown, the circuitry includes a fitting 300 attachable to the actuated cylinder valve (not shown) of the high pressure cylinder (see FIG. 1). The high pressure gas cylinder thus is coupled to the portion of the flow circuit shown, by means of fitting 300. The flow circuitry includes inert gas feed line 116 having a check valve 306 disposed therein, and a nitrogen purge valve 172. The process gas discharge conduit 150 has a filter 304 disposed therein, as well as optional gas purifier 142 and purifier isolation valves 144 and 146. The branch line 152 is joined to the process gas discharge conduit 150 and is provided with a bypass valve 148 therein.

Pump exhaust line 310 is joined to a mechanical pump (see FIG. 2) and has flow control valve 180 disposed therein. Between the inert gas feed line 116 and line 150/310 is disposed pressure regulator 140 and flow control valve 302.

Figure 5:
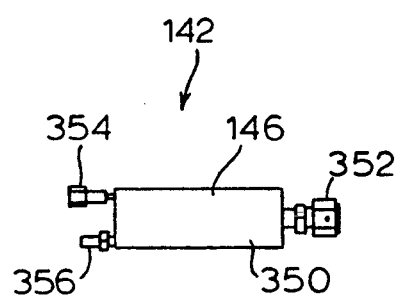
FIG. 5 is a front view of a gas purifier device such as may be employed in the flow circuitry of FIG. 4.

FIG. 5 is a side elevation view of the optional gas purifier 142 (see FIGS. 1 and 4), comprising a purifier vessel 146 of the type shown in FIG. 2 of copending U.S. application Ser. No. 07/295,419 filed Jan. 10, 1989. The purifier comprises a main cylindrical vessel housing 350, containing a bed of a suitable sorbent material which is selectively sorptive for constituents of the gas flowed through such vessel. At the respective extremities of the vessel are disposed a female nut 352 and associated effluent passage for the vessel, an inlet flow passage 356 comprising a closure fitting secured to a male nut, and a fill port structure 354, by means of which sorbent material may be introduced into the vessel housing 350. It will likewise be appreciated that the specific nuts and fittings employed with the optional purifier may be varied depending on the requirements of the system in which the purifier is employed.

In the gas supply and containment assembly described with respect to FIGS. 1-5, the outer enclosure 110 is a ventilated box that houses the inner gas cabinet 102, a mechanical pump 120, and a small scrubber unit 112. All of the normal safety features present in a standard gas cabinet, e.g., self-closing doors, sprinklers, etc., will be present in the outer enclosure of the gas supply and containment assembly, but have been omitted in the drawings for reasons of clarity.

The scrubber 112 is of relatively small size, and is employed to treat the effluent gas stream resulting from the purge of the inner gas cabinet, and the effluent gas from the mechanical pump 120. It is necessary that this scrubber have a low pressure drop characteristic, since the inner gas cabinet will become pressurized if gas therein cannot be vented quickly enough.

The mechanical pump is utilized rather than other pumping means, such as a venturi generator, since a venturi generator by virtue of its mode of operation constitutes a leak source, which would be detrimental to the operation of the overall supply and containment assembly. The pump may be of any suitable type, as for example an oil-seal pump or a diaphragm pump, the choice of specific type being determined by the characteristics and operation of the gas supply and containment assembly in which same is employed. In practice, a diaphragm pump is preferred in the general practice of the invention. The pump is actuated only when the purge panel is utilized to carry out the automatic/purge vent cycle.

The air-tight gas cabinet 102 houses the hazardous gas cylinder 108 and its associated purge panel. The inner purge panel/gas cabinet is the key to containment of bulk volume hazardous gas leaks in the gas cabinet, since it is in this chamber that the hazardous gas leakage from the cylinder and manifold will be initially contained and prevented from mixing with air. This cabinet is maintained in an inert gas, e.g., nitrogen, atmosphere.

Such inert gas environment in the gas cabinet prevents the oxidation of hazardous gases which are pyrophoric in character, and, in instances where the sorbent material in the scrubber is air-sensitive in nature, prevents the premature decomposition of the scrubber sorbent material.

The nitrogen atmosphere is maintained by an initial rapid nitrogen purge and a slower constant nitrogen purge. For example, in a gas cabinet sized to accommodate a 1000 liter high pressure gas cylinder and configured as shown in FIG. 1, a high rate initial purge of about 50 liters of nitrogen per minute for one hour will reduce the air content in the gas cabinet to below 0.1%, under conditions of perfect mixing of the nitrogen purge gas with the air in the gas cabinet; under conditions of perfect displacement, the concentration of oxygen and water should be at inlet nitrogen levels in approximately 10 minutes (see Shriver, D. F., and Drezdzon, M. A., "The manipulation of air-sensitive compounds," Second Edition, John Wiley & Sons, New York, N.Y., pp. 50–51 (1986)). The effluent from this purging step is vented to exterior duct works without scrubbing, through branch line 132 and (open) valve 134 in the FIG. 1 system.

The subsequent slower purge of nitrogen maintains a low level of oxygen and water vapor in the gas cabinet. Leakage of ambient gases from the environment into the interior of the gas cabinet must be maintained at a relatively low level in order to prevent depletion of the sorbent material in the scrubber, and this condition defines the leak-tightness requirement of the interior enclosure. Nitrogen is introduced to the gas supply and containment assembly 100 in inert gas feed line 116 and directed by branch line 160 to feed line 164, from which it is discharged into the interior volume 104 of the gas cabinet 102. The gas in the interior volume of the gas cabinet then passes into vent line 122 and is passed by feed line 182 to the scrubber 112. In the scrubber, any hazardous gas constituent is scrubbed by the sorbent material contained therein. The resulting hazardous constituent-depleted gas passes from the sorbent bed into discharge line 186 from which it passes into effluent gas line 118 by means of which it is passed out of the gas supply and containment assembly.

The leakage rate of inert gas containing any hazardous or otherwise reactive gas constituent, as passed through vent line 122 to the scrubber via feed line 182, may be maintained at a suitably low rate, e.g., on the order of less than about 0.5 milliliter of gas per minute. If the leakage rate of oxygen and water vapor are greater than such value, the sorbent material in the scrubber will be rapidly used up and prematurely exhausted. At such low leakage rate, the poisoning of the sorbent materials in the scrubber is insignificant, and leakages into the outer enclosure of the gas supply and containment assembly pose no threat to the environment. Such low level of leakage (bleeding of inert gas and any hazardous gas constituent present) from the interior volume of the gas cabinet to the scrubber is readily maintained at suitably low gas flow rates to accommodate scrubbing by scrubber 112.

Thus, in operation, the gas supply and containment assembly is purged by introduction of inert gas, such as nitrogen, to the assembly in inert gas feed line 116, from which it is distributed through the flow circuitry of the assembly, in a manner depending on the specific mode of flow being carried out. In an initial purge mode, wherein the inert gas is passed through the flow circuitry to displace air or other hold-up gas therefrom, the inert gas introduced in inert gas feed line 116 is flowed through line 160 (valve 166 being open) at a rate of for example 50 liters per minute, and into line 164, from which the introduced purge gas is feed into the interior volume 104 of the gas cabinet 102, being subsequently exhausted therefrom in line 132, valve 134 being open.

After the purging of the containment assembly flow circuitry is completed, valves 134, 166, 168, 176, 184, and 188 are opened. In this manner, inert gas continues to flow into inert gas feed line 116, line 162, and discharge line 164 for release into the interior volume 104 of the gas cabinet 102, whereby t he interior volume is maintained under a slight positive pressure of nitrogen. The interior volume gas is withdrawn from the interior volume via withdrawal line 122 and passed via feed line 182 to the scrubber 112, in which the hazardous constituents of the gas stream are chemically sorbed by the sorbent composition therein. The resulting hazardous gas constituent-reduced gas stream then is discharged from the scrubber in discharge line 186 and is finally discharged from line 118 from the gas supply and containment assembly.

Concurrently, the hazardous gas may be selectively withdrawn from gas cylinder 108 by selective opening of the actuated cylinder valve 138, so that gas from the cylinder is passed into discharge line 150, and flows through optional purifier 142, in which any undesired impurities, e.g., water vapor, oxygen, etc., are removed from the hazardous gas, down to suitably low levels, e.g., part per billion concentrations. The resulting high-purity gas is flowed in line 150 to the point of use, such as a chemical vapor deposition chamber for doping of epitaxial thin films of semiconductor material on wafer substrates. The purifier 142, as more fully shown in FIG. 5, may be filled with any sorbent material which is selective for the impurities to be removed in the hazardous gas stream.

FIG. 4 shows an illustrative gas supply and containment assembly flow circuitry which may be implemented in an apparatus of the general type shown in FIG. 1. It will be appreciated that the specific configuration of the flow circuitry for the gas supply and containment assembly may be varied widely, the specific arrangement and elements being selectively employed in accordance with the structural features and operational characteristics of the gas supply and containment assembly in which the flow circuitry is employed. As shown in the FIG. 4 embodiment, the hazardous gas discharge line 150 may have a filter 304 therein for the purpose of filtering particulates or other physical contaminants of the gas stream. The purifier may be isolated in the flow circuitry by closure of gas purifier isolation valves 144 and 146, whereby the purifier may be removed and a new purifier unit subsequently installed, while the bypass valve 148 is open, so that gas flow is directed through branch line 152, while isolation valves 144 and 146 are closed.

The vacuum isolation valve 180 may be employed in this flow circuitry to isolate the mechanical pump (see FIG. 1) by appropriate closure of the valve. The inert gas feed line 116 may as shown contain a check valve 306, to prevent depressurization of the gas cabinet and outer enclosure in the event of an interruption in the flow of inert gas to the gas supply and containment assembly.

A pressure controller (not shown in FIG. 1) monitors the pressure in the gas cabinet 102. In the event of a pressure swing, as a result of gross leakage of hazardous gas into the gas cabinet interior volume, a large solenoid 130 opens the associated valve to relieve the pressure in the gas cabinet. The gas that is thereby released to line 126 passes to a bank of large, continuously evacuated vacuum sump tanks, as more fully shown and described hereafter with respect to FIGS. 7 and 8.

The conductances of the solenoid (automatic valve 130) and the piping (line 126) to the vacuum sumps are chosen to be sufficiently high to remove hazardous gases in a worst case scenario with a low pressure differential (e.g., one atmosphere pressure difference) across the solenoid valve and piping to the vacuum sumps.

Figure 7:
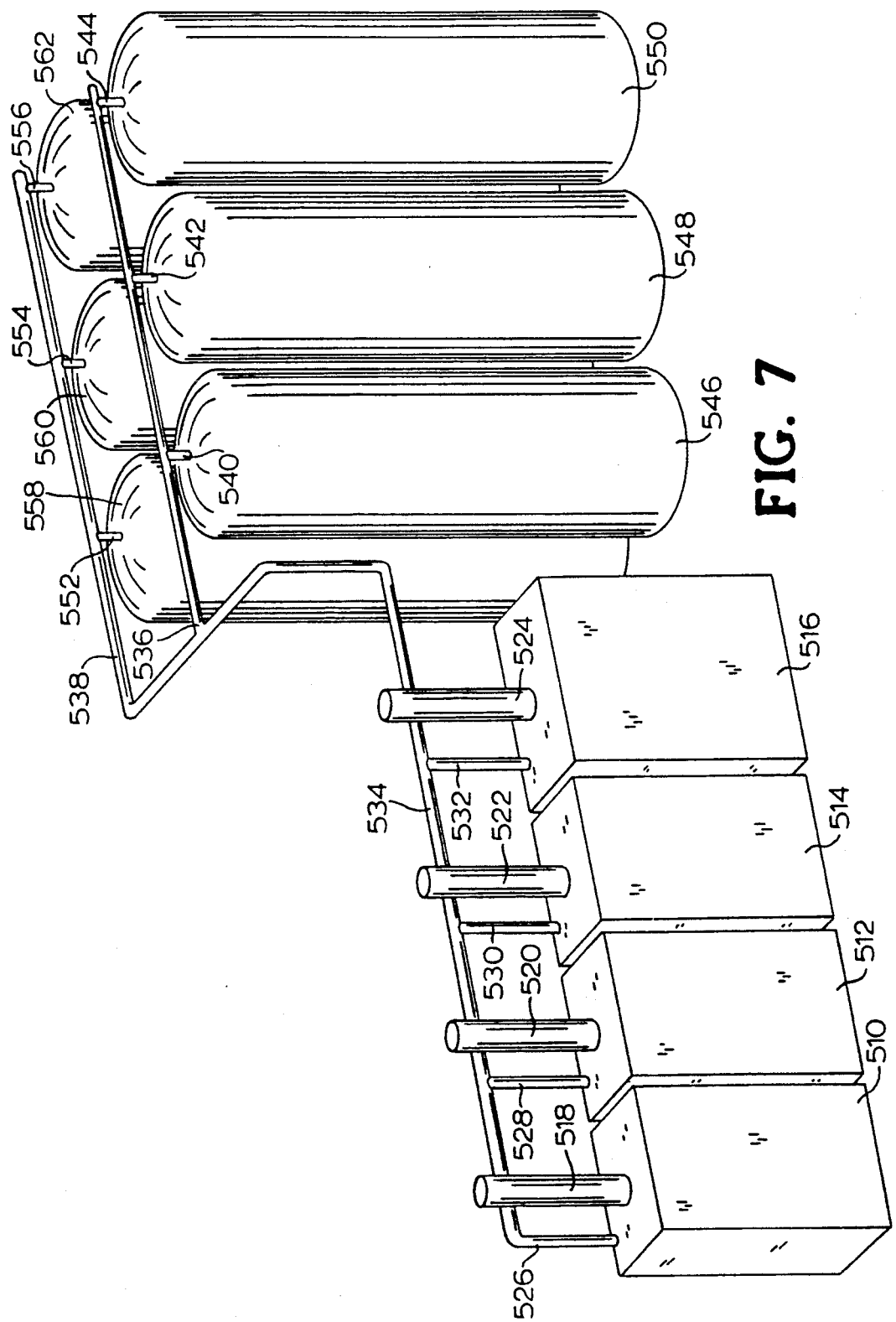
FIG. 7 is a perspective view of the gas supply and containment assembly and vacuum sump array of a gas containment and treatment system such as may be employed in the FIG. 6 embodiment of the present invention.

Thus, the vacuum sump discharge line 126 and associated piping to the multi-tank vacuum sump has a high conductance characteristic. It will be appreciated that multiple tanks are not always required in the vacuum sump, and that a unitary tank may be suitably employed in some instances. The choice of a single or multiple tanks may readily be determined by those of ordinary skill in the art, depending on the tank size and gas volumes which are to be used and accommodated in the system. Discharge line 126 is sized to remove the total flow from a high pressure gas cylinder, e.g., at 2000 psi, whose valve is wide open, and with the only flow restriction being the valve orifice itself. As an example, a 2.5 inch solenoid may be provided having 1.8 times the rate of flow relative to a fully "on" cylinder valve coupled to a gas cylinder at 200 psig internal pressure. The flow coefficient of the gas actuated valve 130 may for example have a value of about 0.188, which in the case of a 2000 psig gas cylinder of 1000 liters volume will result in an internal flow rate of 6000 liters per minute (215 cubic feet per minute) and would constitute the maximum flow load on the gas containment and treatment system. The vacuum sump tank unit will be correspondingly sized to contain the entire contents of the high pressure gas cylinder with a suitable safety margin (e.g., of approximately 25% over-capacity.) In the event of a multiple cylinder network involving series-arranged gas supply and containment assemblies, such as shown in FIG. 7, the vacuum sump tank(s) will be sized to contain the entire contents of the largest cylinder of the array at full pressure with the aforementioned safety margin of over-capacity. The over- capacity is necessary to maintain a pressure differential between the gas cabinet and the vacuum sump so that the entire volume of the hazardous gas flowing from the cylinder can be removed, even at low pressure in the final stages of effluence of gas from the cylinder.

The solenoid valve 130 located at the exit of the outer enclosure 110 to the discharge line 126 may be of any suitable type, but preferably is a large-orifice diaphragm solenoid valve, to connect the gas supply and containment assembly to the high conductance vacuum piping of line 126. Table II below shows the flow rate, in liters per minute, through various common sizes of solenoid valves, based on a pressure drop of 14.7 psi across the solenoid valve, with nitrogen gas at standard conditions being flowed therethrough.

TABLE II

| Pipe Size, inches | Orifice Conductance | Flow, liters per minute |
|---|---|---|
| 0.5 | 2.8 | 738 |
| 1.0 | 13.0 | 3197 |

TABLE II-continued

| Pipe Size, inches | Orifice Conductance | Flow, liters per minute |
|---|---|---|
| 1.25 | 15.0 | 3689 |
| 1.5 | 22.0 | 5534 |
| 2.0 | 43.0 | 10575 |
| 2.5 | 45.0 | 11067 |

The power supply for operation of the solenoid valve which is coupled with the vacuum sumps may suitably include a battery power-pack (not shown) for insuring the operability of the gas supply and containment assembly even in the event of power failure to the unit from conventional power line sources. Thus, the gas cabinet will be protected even in the event of a major power loss to the system, since the vacuum in the sumps will remain for several hours after a power failure with a substantially leak-tight system.

The purge panels in the gas supply and containment system may suitably be located in the gas cabinet 102, to ensure that leakage from the gas cabinet piping will be contained therein. An illustrative purge panel configuration is shown in FIG. 4, previously described.

In an illustrative embodiment, the gas supply and containment assembly described hereinabove with reference to FIG. 1 may employ the following interlocks:

(1) power loss interlock: Loss of electrical power to the assembly will release the actuation pressure to the valves in the purge panel and main cylinder valve. This will result in closing of all valves in the purge panel and the gas cylinder. The effect thus is restricted to a single gas supply and containment assembly, when multiple assemblies are employed in series, as shown for example in FIG. 7.

(2) high temperature: High temperature in the annular space between the gas cabinet and the outer enclosure will result in a water sprinkler (not shown) being actuated to cool the gas cabinet. The water preferably is not introduced inside the gas cabinet. In the event that temperature in the outer enclosure reaches a predetermined high value, plastic actuation lines will rupture resulting in closure of the actuated valves. The effect thus may be limited to a single gas supply and containment assembly in a multi-assembly array.

(3) pressure in vacuum sumps: In order to ensure that sufficient vacuum reservoir capacity is available, the pressure in the vacuum sumps must be below a specific level before the purge panel can be operated, with any suitable set point pressure being employed for such purpose, e.g., a set point pressure of 50 torr. A pressure switch (not shown) may be employed as the excitation signal. The effect of this interlock extends to all gas supply and containment assemblies in a multi-assembly array.

(4) back pressure and gas cabinet vacuum pump: A pressure switch will close when the back pressure of the mechanical pump 120 (see FIG. 1) rises above a predetermined value, e.g., several psig pressure. This interlock affects only a single gas supply and containment assembly in a multi-assembly array.

(5) gas cabinet door on: A switch may be provided which will be closed when the face plate of the gas cabinet is in place. The system will not proceed on the "Box Close" sequence, as more fully hereinafter described, with this switch untriggered. This interlock affects a single gas supply and containment assembly in a multi-assembly array.

The control panel operation for the gas supply and containment assembly of FIGS. 1-5 will now be described with reference to the specific control panel of FIG. 2.

The two rotameters 200 and 202 enter the fast purge and slow purge of the inner box (gas cabinet). The assignment is not critical at this juncture.

The photohelic or other pressure controller 204 is employed to control the opening of the large solenoid to the vacuum sumps.

The gauge 206 for pressure in the vacuum sumps provides a completely mechanical link to the sump pressures.

The back pressure gauge 208 alerts the user that the scrubber in the gas cabinet is not plugging.

The on/off switch 209 turns on the control panel. The box open/closed switch 210 operates so that when the box open position is chosen, the inner box of the assembly can be opened (a pneumatic cylinder lock is retracted). When the box closed position is chosen, the fast purge of the inner box is carried out.

The PV/Gas switch 212 selects between a pressure vent sub-routine or gas flow sub-routine in the control system. The P/V switch 214 permits a PV mode to be selected in which the purge panel in the inner cabinet is pressurized (P) and vented (V).

The N2/Hazardous gas switch 216 permits a gas flow mode to be selected, either nitrogen gas flow or the hazardous gas flow.

Referring now to FIG. 3, there is shown a control panel with five switches, 260, 262, 264, 266, and 268, that control power to the overall system and the individual components. The main power switch 260 controls electrical power to the system. If the main power switch is "off," all of the normally closed valves to the process will be "off" (closed). When the main power switch is actuated, the vacuum pump is turned on and the instruments are powered up.

The A/B switch 262 selects the scrubber network (disclosed hereafter with reference to FIGS. 8 and 9) through which the process gases will be flowed for bulk sorption treatment.

The operate switch 264 actuates a pair of solenoids to open appropriate inlet and outlet pneumatic ball valves on either the A or B scrubber tank, as described hereinafter.

The nitrogen purge switch 266 activates the nitrogen gas purge to the inlets of the effluent gas scrubber, as described hereinafter. This switch triggers the solenoid which in turn provides nitrogen gas to the filter housing. The purge line that is opened is selected by the A/B selector switch 262. Both the operate switch 264 and the nitrogen purge switch 266 must be "on" for purge gas to flow.

Figure 9:
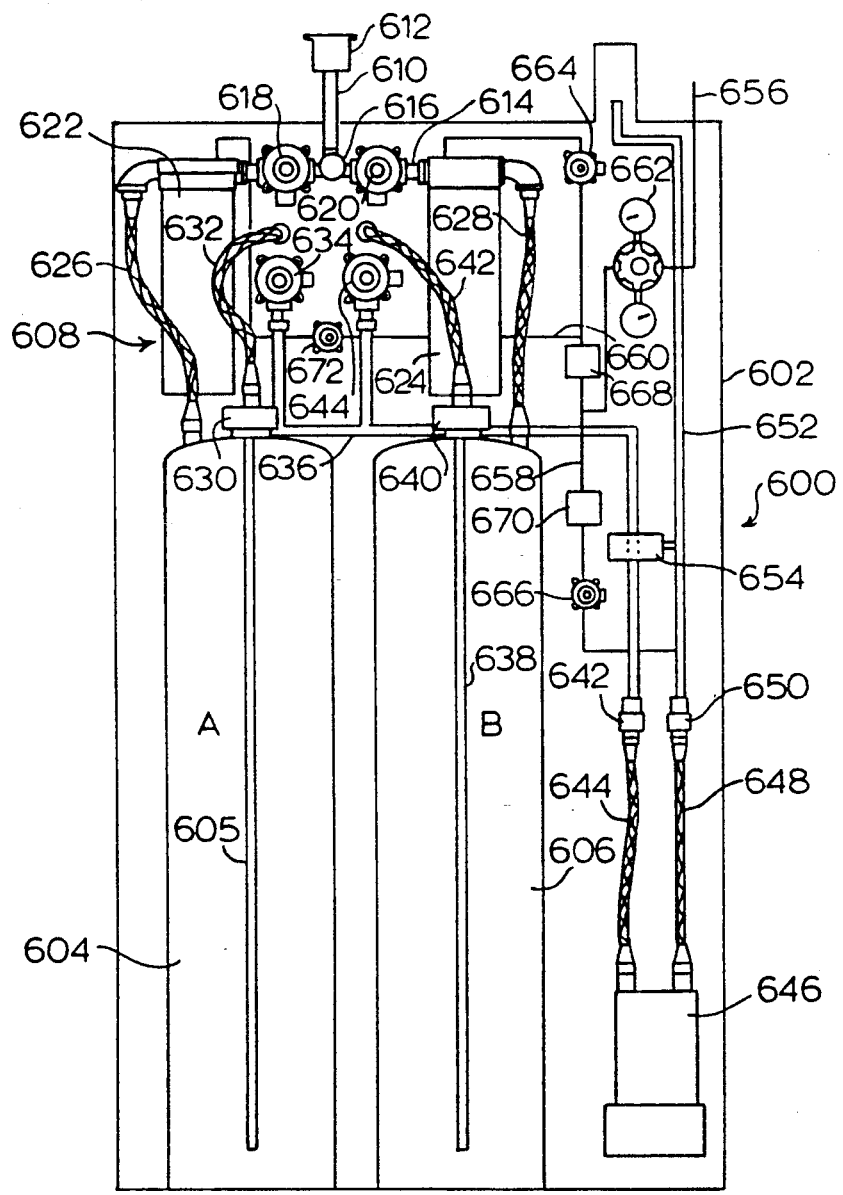
FIG. 9 is a sectional elevation view of a gas sorption apparatus according to another embodiment of the invention, comprising switchable tanks containing selective absorbent material.

The nitrogen dilution switch 268 activates nitrogen dilution to the exit of the outlet of the assist vacuum pump 646 (see FIG. 9). This switch triggers the solenoid which, in turn, provides nitrogen gas to the pneumatic dilution nitrogen valve 666 (see FIG. 9).

The flow rates for the purge and nitrogen streams are monitored and controlled on individual rotameter/valve pairs (252 and 256; and 254 and 258).

The high pressure controller 271 will trigger a light or other high pressure alarm 270 and a relay within the assembly in the event of a high pressure condition. The control signal from the high pressure controller relay is adaptable to be employed with suitable control elements which function to maintain a predetermined pressure condition.

The end point detector 273 will trigger a light or other end point alarm 272 and relay within the unit in the event of an initial scrubber breakthrough (see the discussion hereinafter relating to the scrubber system of FIGS. 8 and 9). The signal from the end point detector relay may be employed for control or switching of multiple tanks in the scrubber unit, as hereinafter more fully described.

Figure 6:
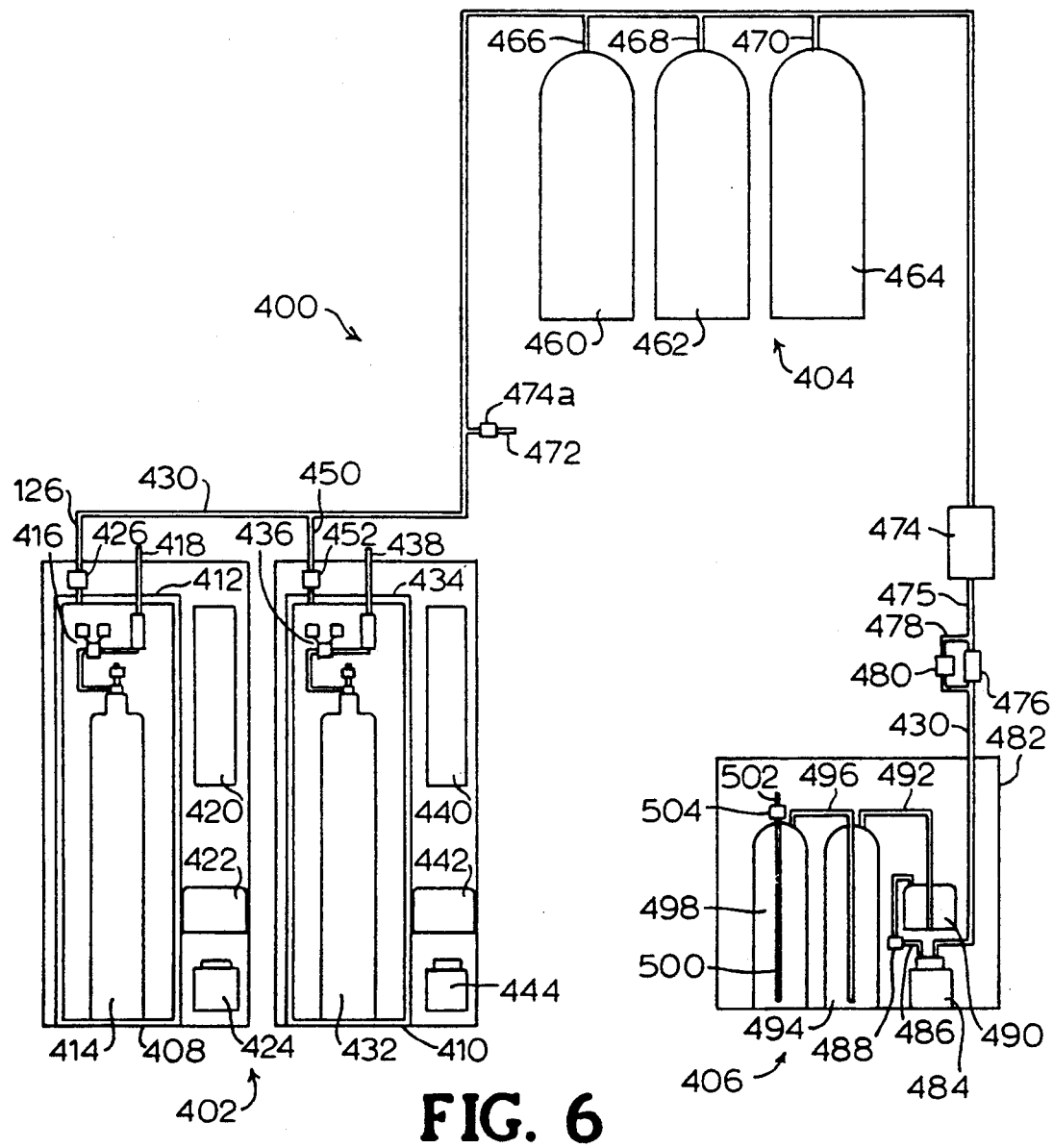
FIG. 6 is a schematic representation of a gas containment and treatment system, according to one embodiment of the invention.

FIG. 6 is a schematic representation of an integrated gas containment and treatment system 400, comprising an array of multiple gas cabinet/enclosure assemblies 402, coupled in selectively establishable flow communication with a vacuum sump array 404, with the vacuum sump array 404 in turn being joined in selectively establishable flow communication with gas scrubbing unit 406.

The gas cabinet/enclosure assembly array 402 comprises two gas cabinet/enclosure assemblies 408 and 410 in the embodiment shown. Gas cabinet/enclosure assembly 408 includes an inner gas cabinet 412 containing a high pressure hazardous gas cylinder 414 attached to suitable gas cabinet flow circuitry 416 and hazardous gas discharge conduit 418 for discharge of the hazardous gas to downstream use apparatus. This assembly also includes a non-hazardous gas purge panel 420, a scrubber 422 and mechanical pump 424, as well as a high conductance solenoid valve 426 in a high conductance vacuum sump discharge line 126, which at its outer end is joined to the vacuum sump header conduit 430.

Gas cabinet/enclosure assembly 410 is correspondingly constructed with high pressure hazardous gas cylinder 432 being disposed in the interior gas cabinet 434 and coupled to suitable gas cabinet flow circuitry 436, including a hazardous gas discharge line 438 for flowing the hazardous gas to the downstream locus of use therefor. The outer enclosure of this gas cabinet/enclosure assembly includes a non-hazardous purge panel 440, a scrubber unit 442, and a mechanical pump 444, with the gas cabinet 434 being joined by means of high conductance vacuum sump discharge conduit 450, having high conductance solenoid valve 452 therein, to the vacuum sump header conduit 430.

The vacuum sump header conduit 430 interconnects the gas cabinet/enclosure assemblies 402 to the vacuum sump tanks 460, 462, and 464, making up the vacuum sump array 404, with each of the respective tanks being joined to the vacuum sump header conduit by a corresponding line 466, 468, and 470, respectively. The vacuum sump header conduit 430 also is joined to a nitrogen back-fill line 472, having flow control valve 474 disposed therein, for controllably introducing nitrogen gas to the vacuum sump header conduit.

The vacuum sump header conduit 430 in turn connects the vacuum sump array 404 with the scrubber unit 406. The vacuum sump header conduit immediately upstream of the scrubber unit has a check valve 475 and a high conductance filter 474 disposed therein, downstream of which is a high conductance valve 476, and a branch line 478 containing a low conductance valve 480 therein.

Figure 8:
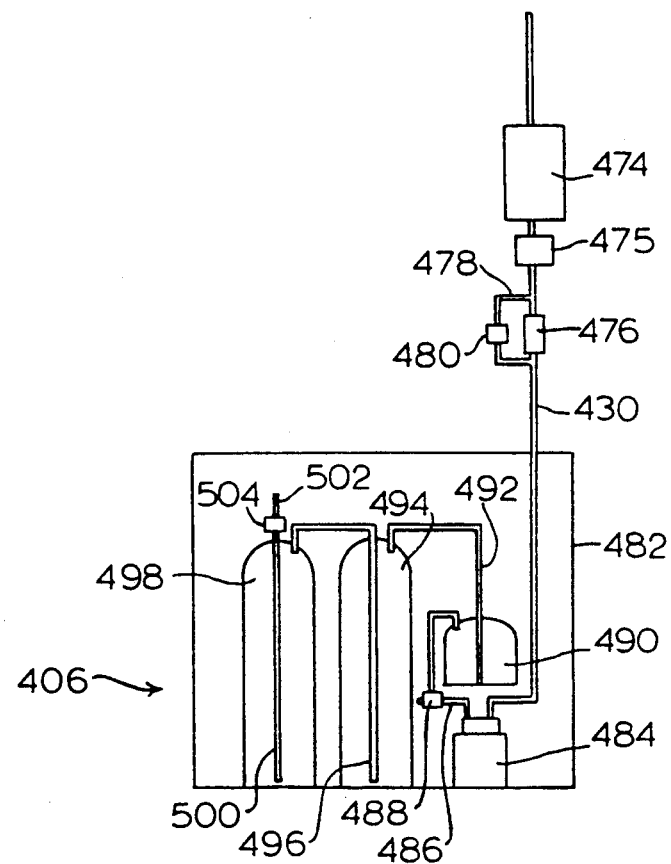
FIG. 8 is a schematic representation of a gas sorption apparatus, such as may be employed in the gas containment and treatment system of FIG. 6.

The scrubber unit 406 is more fully shown in FIG. 8 as including a vented cabinet enclosure 482 into which the vacuum sump header conduit 430 extends and is connected to pump 484. The pump in turn is joined to a discharge line 486, containing a scrubber bypass valve 488. The pump discharge line 486 communicates with the upper portion of an optional change-out scrubber 490.

The optional change-out scrubber 490 has joined thereto a discharge line 492, the lower end of which is disposed at a lower portion of the sorbent bed in the scrubber. The opposite end of the discharge line 492 communicates with the upper end of a first main scrubber 494, which as shown has a discharge line 496, extending therethrough to a lower portion of the sorbent bed (not shown) in such vessel, and extending exteriorly of such scrubber to the upper portion of a second main scrubber 498. The second main scrubber is equipped with a discharge conduit 500, which extends from a lower end at the bottom portion of the main scrubber vessel to an exterior end 502 having flow control valve 504 disposed therein.

FIG. 7 shows a perspective view of a portion of a gas containment and treatment system comprising an array of three gas cabinet/enclosure assemblies 510, 512, and 514, and a scrubber unit 516. These assemblies feature respective discharge ducts 518, 520, 522, and 524. These ducts contain the discharge lines 118 and 132 for each gas cabinet/enclosure assembly (see FIG. 1). These gas cabinet/enclosure assemblies also feature respective vacuum sump discharge lines 526, 528, and 530, which connect these respective gas cabinet/enclosure assemblies to the vacuum sump header conduit 534, which in turn communicates with header conduit branches 536 and 538. The header conduit 534 is also joined to scrubber unit 516 by line 532. Branch conduit 536 is joined via lines 540, 542 and 544 to vacuum sump vessels 546, 548, and 550, respectively. In like manner, branch conduit 538 is joined via feed lines 552, 554, and 556 to vacuum sump tanks 558, 560, and 562, respectively. It will be understood that the respective vacuum sump header branch conduits 536 and 538 in turn are joined in selectively establishable flow communication with suitable scrubber unit(s) as shown in FIG. 6. For such purpose, the header branch conduits 536 and 568 may joined downstream of the vacuum sump vessel array, with a single sump header conduit in turn passing to the scrubber unit as is shown in FIG. 6. Alternatively, each of the branch lines of the vacuum sump header conduit may subsequently pass to separate scrubber units, the choice of specific scrubber unit arrangement being within the purview of skill in the art. It will also be appreciated that the number of gas cabinets, as well as the number of sump tanks, in the gas containment and treatment system may be varied widely, comprehending the employment of single gas cabinet and sump tank systems as well as systems comprising multiple gas cabinets and sump tanks, as well as various permutations thereof. It is also within the purview of the broad scope of the present invention to employ a gas cabinet/enclosure assembly containing more than one gas cabinet (inner box) in a single outer enclosure.

The vacuum sump vessels (tanks 546, 548, 550, 558, 560, and 562 in FIG. 7) are suitably provided as large air cylinders that are continuously evacuated, e.g., by a mechanical pump as in the scrubber unit shown in FIG. 6. The total volume of the sump vessels is greater than the volume of gas contained in a high pressure gas cylinder. This permits the entire contents of a high pressure gas cylinder to be evacuated to the vacuum sump vessels. As indicated, a suitable safety factor on oversizing of the vacuum sump vessel volume is desirable, relative to the volume of the gas cylinder(s) which may require evacuation to the sump vessels. As an example, the sump vessels may be oversized by a factor of 25% relative to the gas cylinder volume, to ensure that the full amount of gas from the cylinder(s) can be stored and still remain under vacuum, so that all leaks will be inboard under such pressure conditions.

In providing vacuum sump capacity for a plurality of gas cabinet/enclosure assemblies, wherein different ones of the constituent assemblies deliver different gases, the arrangement of vacuum sump vessel(s) and scrubber unit(s) may have to accommodate gases which are not compatible. Correspondingly, compatible gases from different gas supply and containment assemblies can be joined in flow communication with a common header conduit and vacuum sump array. It will also be appreciated that the volume and conductances of transfer conduits may be varied in specific end use applications, and such design considerations and variations are within the skill of the art.

The vacuum sump header conduit and associated piping may be of any suitable construction, provided that the piping network is leak-tight in character.

The vacuum sump vessels can be low pressure air cylinders such as those commonly employed in compressed air applications. Such vessels are readily available in large sizes, e.g., on the order of 1000 liters, and at relatively low cost.

The nitrogen back-fill line 472 (see FIG. 6) may be joined to a suitable source of nitrogen gas (not shown), to allow nitrogen back-filling of the vacuum sump array, to provide efficient purging and inerting thereof.

The vacuum sump array is suitably evacuated by a mechanical pump in the scrubber unit, such as pump 484 in scrubber unit 406 shown in the illustrative FIG. 6 system. In this illustrative embodiment, a high conductance filter 474 upstream of check valve 475 is required in the vacuum sump header conduit to capture particulates from the large vacuum sump vessels. The conductance of filter 474 should be relatively high in magnitude.

The inlet to the mechanical pump 484 is a pipe having modest conductance requirements. A high conductance valve 476 is provided in the vacuum sump header conduit, together with a branch conduit 478 containing a low conductance valve 480.

The effluent from mechanical pump 484 is passed through the serial scrubber vessels 494 and 498 in the FIG. 6 embodiment, via respective feed lines 492 and 496, with discharge of finally scrubbed gas from the second scrubber vessel 498 in discharge line 500.

A scrubber bypass valve 488 is provided in the pump discharge line 486 to vent the pump during initial and maintenance pump-downs of the vacuum sump vessels. In use, this valve may be vented to duct works in the gas processing facility until either a hazardous gas is detected in the gas cabinet of an associated gas supply and containment assembly, or until the large solenoid opens to release gas pressure from the gas cabinet.

Valve 504 at the discharge end 502 of discharge line 500 will normally be closed, opening when the effluent from the pump 484 is directed to the sequential scrubber vessels. This valve functions in use to protect the sorbent material in the scrubber vessels from back-diffusion of air.

The high conductance valve 476 in vacuum sump header conduit 430 is provided for rapid pump-downs of the vacuum sump vessels. The low conductance valve 480 is employed when gases are fed to the scrubbers in the scrubber unit 406. Control circuitry (not shown) may be provided for switching between the respective valves depending on the mode of scrubber function and the pressure in the vacuum sump vessels.

The inlet valves (high conductance valve 476 and low conductance valve 478) are actuated by the same electrical power source (not shown) as the vacuum pump 484. In the event of a power failure resulting in shut-down of the pump, both inlet valves close to maintain vacuum conditions in the vacuum sump vessels, and check valve 475 is provided as a redundancy feature in the system for such purpose.

The pumping speed of the mechanical pump may be varied to achieve a specific rate of pump-down of the vacuum sump vessels to a predetermined sub-atmospheric pressure level. The pump in the scrubber unit preferably is explosion proof and may be of any suitable type, e.g., of the oil variety.

The scrubber vessels 494 and 498 in the scrubber unit 406 are preferably of a size and capacity accommodating a full gas cylinder release in the gas cabinet of the gas supply and containment assembly associated with the scrubber unit. Preferably, at least two scrubber vessels are provided. The initial scrubber vessel 490, as shown in FIG. 6, may be a so-called "change-out" scrubber unit, which is designed to remove small amounts of hazardous gas constituents and to protect the larger scrubber vessels. Thus, the change-out unit may be replaced periodically, while the large scrubber vessels are changed only very infrequently. It will be recognized, however, that the size, capacity, and number of scrubber vessels in the scrubber unit may be varied widely, depending on the nature of the hazardous gas constituents and the character of the specific system employed. Preferably, the beds of sorbent material in the respective scrubber vessels will be sized with some safety factor, e.g., a 40% excess of material, to provide a margin of safety for reliable operation.

The scrubber unit 406 shown in FIG. 6 may be operated such that under normal operating conditions, the exhaust of the pump 490 is not passed through the scrubber vessels 490, 494, and 498, but instead is routed by a 3-way valve 488 on the exhaust line 486 of the pump to an unscrubbed exhaust duct (not shown). In the event of a hazardous gas leak or actuation of the large pressure release solenoid, the exhaust from the pump then would be routed by adjustment of the 3-way valve through the respective scrubber vessels. In addition, the inlet valve assembly in the line from the vacuum sumps to the pump would be switched from the high conductance valve, to the low conductance valve to limit the space velocity of gas flowed through the sorbent beds in the respective scrubber vessels.

FIG. 9 is a front elevation view of a switchable multi-tank gas sorption system 600, comprising a cabinet 602 in which are mounted a first scrubber tank 604 (Tank A), and a second scrubber tank 606 (Tank B). The tanks are arranged in vertically oriented side-by-side arrangement.

Each of the scrubber tanks A and B contains a suitable selective sorbent material (not shown) which is selective for the specific hazardous gas constituent(s) to be removed by the scrubber unit.

The scrubber unit features gas flow circuitry 608 which is connectable to a source of gas (not shown) for introducing the gas to the a selected one of the two scrubber tanks.

The flow circuitry 608 includes a source gas feed conduit 610 having a suitable connection fitting 612 at its upper end, and joined at its lower extremity to a feed manifold 614 having pressure transducer 616 therein, at the junction between the source gas feed conduit 610 and the feed manifold 614. Disposed in the feed gas manifold are independently actuatable flow control valves 618 and 620. Also disposed in the feed manifold, peripherally to the flow control valves 618 and 620, are prefilters 622 and 624, respectively. At its outer extremities, the feed manifold is joined to a first inlet conduit 626 and a second inlet conduit 628, as shown. The inlet conduits 626 and 628 may suitably comprise stainless steel braid over Teflon ®polytetrafluoroethylene tubing.

The first scrubber tank 604 is provided with a discharge tube 605 extending into the lower portion of the tank and joined at its upper end, via coupling 630, to discharge conduit 632. This discharge conduit has flow control valve 634 disposed therein and is joined at its other end to the outlet manifold 636.

In like manner, the second scrubber tank 606 is equipped with a discharge tube 638 extending into a lower portion of the tank and joined at its upper end, via coupling 640, to a second discharge conduit 652. The second discharge conduit has flow control valve 644 disposed therein and is joined at its other end to the outlet manifold 636. The portions of the respective first and second discharge lines 632 and 642 between the respective scrubber tanks and the flow control valves therein may suitably comprise stainless steel braid over Teflon ®polytetrafluoroethylene tubing.

The outlet manifold 636 is joined by fitting 642 to inlet tubing 644 of mechanical pump 646. The pump has a discharge tubing segment 648 which is joined by fitting 650 to scrub gas discharge conduit 652. The scrub gas discharge conduit is equipped with an end point sensor 654 communicating therewith, to sense a selected end point indicative of the exhaustion of a sorbent bed in the scrubber tank through which hazardous constituent-containing gas is being passed.

The scrubber unit 600 further comprises a nitrogen inlet conduit 656 which is connected interiorly of the gas scrubber unit to a purge flow circuit comprising lines 658 and 660. The nitrogen inlet conduit 656 contains a regulator assembly 662, while line 658 contains purge solenoids 664 and 666, as well as flow meters 668 and 670, and line 660 contains purge solenoid 672.

It will be recognized that the stainless steel braid over Teflon ® polytetrafluoroethylene tubing described herein is intended to be illustrative in character only, and that the tubing and conduits and lines of the scrubber unit may be widely varied in construction and composition, as appropriate to a specific end use application.

The end point sensor 654 in the scrubbed gas discharge conduit 652 may be of any suitable type appropriate to indicate the exhaustion of a predetermined extent of capacity in the sorbent bed in the scrubber tank undergoing active gas processing. For example, the end point sensor may comprise a pH electrode, which is maintained in a moist position by a suitable wick in communication with a reservoir of water, to sense pH changes indicative of exhaustion of sorbent bed capacity. Alternatively, the end point sensor may comprise a turbidity sensor, which for example may be usefully employed in the scrubbing of silane-containing gases.

In operation, the gas to be scrubbed enters the scrubber unit through fitting 612 and source gas feed conduit 610, from which it flows into the feed manifold 614. The pressure of the source gas at the inlet is monitored by the pressure transducer 616 and an associated pressure controller (not shown). The gas stream is routed to a selected one of the two scrubber tanks through an appropriate one of the inlet valves 618 and 620, which may comprise large inlet ball valves. These valves are opened by the "Operate" switch (see FIG. 3).

The gas in the feed manifold after being directed to one end thereof is initially filtered by an appertaining one of the prefilters 622 and 624, which may comprise wound cartridge filters, e.g., a 20 micron polypropylene filter element in a suitable filter housing.

The gas stream flows from the prefilter to the appertaining scrubber tank through the inlet conduit associated with the selected scrubber vessel. The scrubber vessel contains a suitable sorbent material selective for the hazardous gas constituents which are desired to be removed from the influent gas stream to the scrubber unit. Hazardous constituent-containing gas flows into the head space of the scrubber tank and is flowed downwardly through the sorbent bed (not shown) therein, and the scrubbed gas then enters the discharge tube (dip tube) and passes upwardly to the top of the scrubber tank and into the outlet manifold.

The resulting scrubbed gas flows through the discharge conduit associated with the scrubber tank being employed, to the pump 646. The discharge lines 632 and 642 contain respective outlet valves 634 and 644 which are actuated pneumatically from the "Operate" switch-/solenoid pair (see FIG. 3).

The pump 646 may be of any suitable type, as for example, a diaphragm pump rigidly mounted to the cabinet 602. The feed tubing 644 may suitably include a flexible assembly for isolation of vibration associated with the pump. The pressurized scrubbed gas is discharged from pump 646 into discharge segment 648 and flows therefrom through the discharge conduit 652 and is passed to duct works or other disposition means exterior of the scrubber unit cabinet.

A nitrogen dilution solenoid valve 666 is located in the line 658 attached to the discharge conduit 652. This solenoid valve is actuated by the "Dilution nitrogen" switch (see FIG. 3) on the control panel of the associated gas supply and containment assembly.

The end point sensor 654 coupled to the discharge conduit 652 signals a breakthrough of the hazardous gas constituent of interest in the sorbent bed of the primary scrubber (A or B) which then is on-line, i.e., actively processing hazardous constituent-containing gas. When the end point controller alarm is activated, the influent gas flow to the scrubber unit will be switched to the other scrubber tank. Upon switching, the end point sensor will drop below its set point as the other, previously inactive scrubber tank is brought on-line, and gas subsequently is contacted with the sorbent bed therein. Thereafter, the previously on-line scrubber tank can be uncoupled from the scrubber unit and replaced with a new scrubber tank or a new charge of sorbent material to replace the exhausted sorbent material introduced in the removed scrubber tank.

Prior to such processing of hazardous constituent-containing feed gas, the scrubber unit may be purged by flow of nitrogen or other inert or suitable purge gas through the purge flow circuitry, including lines 656, 658, and 660. In this manner, the prefilters 622 and 624, scrubber tanks A and B and all associated flow circuitry in the cabinet 602 can be purged to prepare the scrubber unit for subsequent active gas processing operation.

The scrubber unit illustratively shown in FIG. 9 may have a relatively compact size. For example, cabinet 602 may have a height of 56 inches, a width of 32 inches, and a depth of 16 inches. The nitrogen purge gas may be provided in any suitable form, as for example a high pressure cylinder of nitrogen at a pressure of for example about 50 psig. The scrubber unit may be designed for a relatively high flow rate of gas therethrough, as for example on the order of about 30 liters per minute.

Concerning the scrubber units illustratively shown and described in FIGS. 6, 8, and 9 hereof, a serial arrangement of scrubber tanks containing sorbent material may be preferred in various instances due to its simplicity and increased reliability in a major leakage event, relative to a parallel system.

As discussed hereinabove, the sorbent material utilized in scrubber vessels in the broad practice of the present invention may be of any suitable type appropriate to the sorptive removal of the hazardous gas constituent(s) present in the gas being treated, including the sorbent compositions disclosed in U.S. application Ser. No. 295,419 filed Jan. 10, 1989; U.S. application Ser. No. 163,792 filed Mar. 3, 1988; and U.S. Pat. No. 4,761,395.

It is also within the purview of the present invention to utilize a sorbent composition in scrubber tanks comprising a multiplicity of sorbent materials, each one having specific selectivity for specific constituent(s) of a hazardous gas stream containing multiple hazardous constituents.

Such multicomponent hazardous gas streams may for example include mixtures of germane, phosphine, arsine, and silane constituents, with trace amounts of water and oxygen impurities.

Another example of a multicomponent hazardous gas mixture is encountered in tungsten metallization applications, in which tungsten hexafluoride is used as the source reagent for tungsten deposition, and the tungsten hexafluoride-containing gas also comprises a silane component such as silane, halosilane, or mixtures thereof. Such streams are particularly problematic to treat with respect to removal of the silane and tungsten hexafluoride constituents, since the silane is readily converted in the presence of water or hydroxy compounds to silica. Tungsten hexafluoride is also reactive with water to form tungsten oxide ($WO_3$) and hydrofluoric acid. The silicon and tungsten oxides are solid compounds, and thus present a potential plugging problem, as well as raising the potential for abrasive damage and scoring of valve, pump, and piping surfaces. An example of such a tungsten halide/silane stream is one comprising tungsten hexafluoride, silane ($SiH_4$) and silane tetrafluoride. The silicon compounds in this gas mixture are employed in the low temperature epitaxial growth of silicon layers.

In sorbent systems wherein a molecular sieve or other aluminosilicate is impregnated with aqueous base solution, as for example is described in U.S. Pat. No. 4,535,072 issued Aug. 13, 1985 and assigned to the Japan Oxygen Company, Ltd., the water constituent impregnated in the aluminosilicate has been found to create the potential for back-diffusion of water from the aluminosilicate to the inlet of the aluminosilicate sorbent bed, with consequent tendency to form silica and tungsten oxide particulates at such bed inlet, by reaction of water with the tungsten halide and silicon compounds being flowed through the bed for removal thereof from the gas stream being treated.

Unexpectedly, it has been found that a sorbent zone of dry aluminosilicate sorbent may be provided between the aqueous base material-impregnated aluminosilicate and the influent tungsten halide/silicon compound(s) gas stream, and that such interposed "guard bed" is efficacious to prevent back-diffusion of water in the process system, such as otherwise would result in formation of particulate silicon and tungsten oxides with consequent adverse affect on the process system.

Such guard bed of dry or otherwise hygroscopic aluminosilicate may be extremely small in relative volume as compared to the volume of the aqueous base-impregnated aluminosilicate material, as for example on the order of from about 3% to about 20% by volume of dry alumino-silicate, based on the volume of the aqueous base-impregnated aluminosilicate material. Preferably, the guard bed of hydroscopic aluminosilicate is from about 5% to about 15% by volume, based on the volume of the aqueous base-impregnated aluminosilicate. Thus, by way of example, the aqueous base solution-impregnated aluminosilicate may comprise a Linde 13X molecular sieve (Union Carbide Corporation, Danbury, Conn.) impregnated with an aqueous solution of lithium hydroxide, wherein the ratio of lithium hydroxide to water to molecular sieve may be on the order of 2:15:100 parts by weight, respectively.

Figure 10:
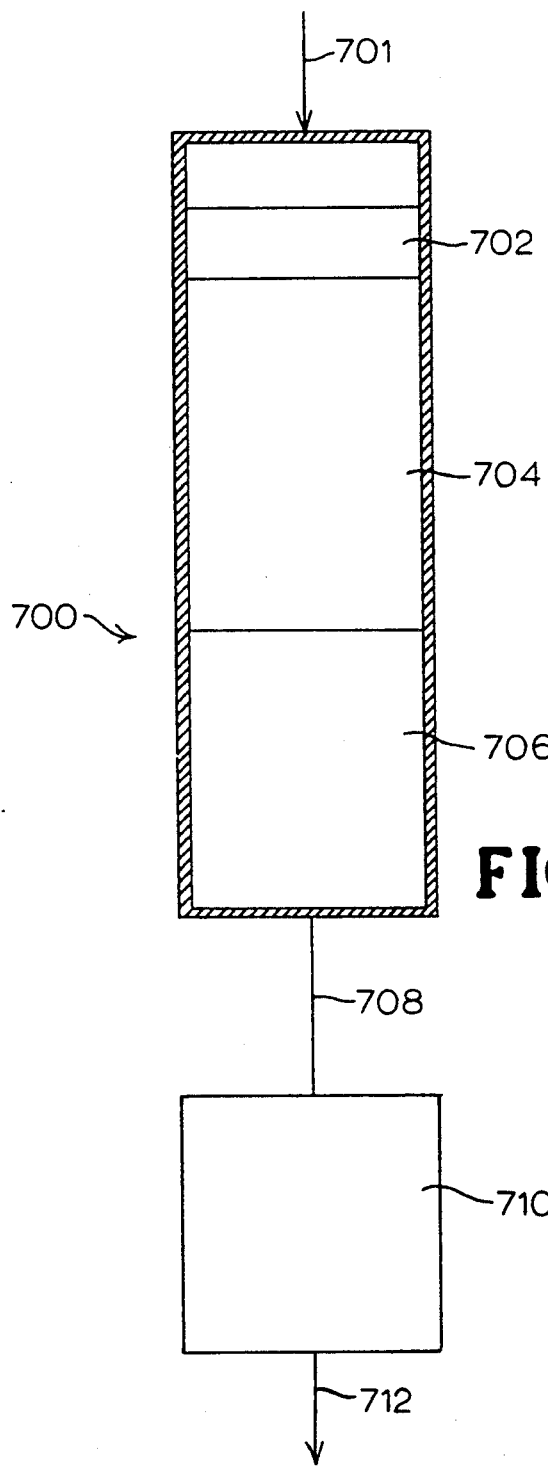
FIG. 10 is a schematic representation of a multizone gas purifier composition embodying a serial arrangement of sorbent beds, such as may be employed in the gas sorption apparatus shown in FIGS. 8 or 9.

FIG. 10 is a schematic representation of a multizone gas purifier composition embodying a serial (A)(B)(C) arrangement of sorbent beds. This gas purifier composition 700 includes a first sorbent bed 702 comprising an aluminosilicate sorbent which is hygroscopic in character. The hygroscopic aluminosilicate sorbent may for example comprise a molecular sieve or other aluminosilicate which is "dry" in the sense that it has not been impregnated or does not otherwise contain significant water. This sorbent bed thus functions as a guard bed for the gas mixture which is introduced in line 704 for contacting with the sorbent composition. The first sorbent bed 702 is termed sorbent (A), for purposes of the (A)(B)(C) serial arrangement, wherein the gas to be treated in contacted initially with bed (A), then bed (B), then bed (C).

The second sorbent bed 704, or bed (B), contains an aqueous base solution-impregnated aluminosilicate material, such as is disclosed in the aforementioned U.S. Pat. No. 4,535,072, and which is effective for removing silane and/or halosilane constituents from the gas mixture introduced to the sorbent composition in line 704. The second sorbent 704 also is effective to remove tungsten halides from the gas mixture containing same.

As an optional bed (C), the sorbent composition shown in FIG. 10 may comprise a third sorbent bed 706, which may for example comprise an inorganic support impregnated with a scavenger composition comprising an organometal scavenger species such as alkyllithium. Such inorganic support may comprise any suitable inert material, such as alumina, silica, aluminosilicates, carbon, graphite, kieselguhr, etc. The organometallic active scavenging species in bed (C) is effective for removing oxidants such as oxygen, and acid gas constituents such as arsine and/or phosphine. In this (A)(B)(C) serial arrangement of beds, the bed (A) removes water and thus prevents back-diffusion of water which would result in formation of the undesirable silicon and tungsten oxides as reaction products. Correspondingly, the aqueous base solution-impregnated aluminosilicate removes silanes and halosilanes, while bed (C) removes oxygen and acid gas species.

The resulting treated gas, depleted in water, oxygen, and acid gas constituents as (silanes, halosilanes, arsine, and phosphine), then optionally may be passed in line 708 to a contacting zone 710 containing an oxidizing agent. Such agent suitably is of strongly oxidizing character, e.g., potassium permanganate, or other oxidizing agent which is able to effect the removal of hazardous gas constituents such as germane which may be present in the multicomponent gas mixture introduced to the serial arrangement of sorbent beds.

The gas contacted with the potassium permanganate or other oxidizing agent, to the extent that same includes constituents other than those sorptively removed in the various sorbent beds of the FIG. 10 system, is discharged in line 712 for disposal or other end use treatment thereof.

In the multizone gas purifier compositions illustratively described hereinabove, the aluminosilicate constituent preferably is a molecular sieve material. In bed (C), the inert support preferably is alumina, and the organometallic scavenger species preferably is an alkyllithium compound.

Preferably, the multizone gas purifier composition shown in FIG. 10 is arranged in the vertical arrangement as illustrated wherein influent gas is downwardly directed through an initial (guard bed) zone of aluminosilicate sorbent, followed by a next succeeding zone of aqueous base solution-impregnated aluminosilicate material, followed by the remaining optional treatment zones of alkylmetal scavenger and oxidizing agent, respectively. The multizone gas purifier composition may thus be provided in a gas purifier unit comprising a vertically extending gas contacting vessel having disposed therein a serial array of sorbent beds (A)(B) or (A)(B)(C).

A preferred base material utilized as the impregnant in the second sorbent zone 704 (bed (B)) is lithium hydroxide, although sodium hydroxide or other base materials may be utilized to good advantage in various applications, depending on the silane or other constituent which is removed thereby in the gas to be scrubbed.

A preferred aqueous base solution-impregnated aluminosilicate composition comprises from about 1% to about 5% by weight of lithium hydroxide, and from about 10 to about 25% by weight of water, based on the total weight of the aluminosilicate support material.

Preferably, the guard bed, or "cap," of dry molecular sieve material at the influent end of the multizone sorbent composition does not exceed about 15% by volume of the volume of the aqueous base solution-impregnated aluminosilicate bed, and most preferably from about 5 to about 15% by volume, on the same basis.

Thus, one aspect of the present invention relates to the treatment of a gas mixture containing impurities comprising (1) a tungsten halide compound and (2) a silane component selected from the group consisting of silanes, halosilanes, and mixtures thereof, by the steps including:

(a) providing a sorptive composition including an initial sorbent volume of dry aluminosilicate and a succeeding sorbent volume of aluminosilicate material impregnated with an aqueous base solution, such as an aqueous hydroxide, and most preferably an alkali or alkaline earth metal hydroxide, e.g., sodium hydroxide, lithium hydroxide, and/or calcium hydroxide;

(b) flowing the gas mixture through the initial sorbent volume and succeeding sorbent volume in series; and (c) recovering a purified gas of reduced impurity content.

As discussed hereinabove, the two-zone aluminosilicate composition may be followed in series by any other sorbent materials which are necessary or appropriate to sorptive removal of impurity constituents from the gas being treated.

Figure 11:
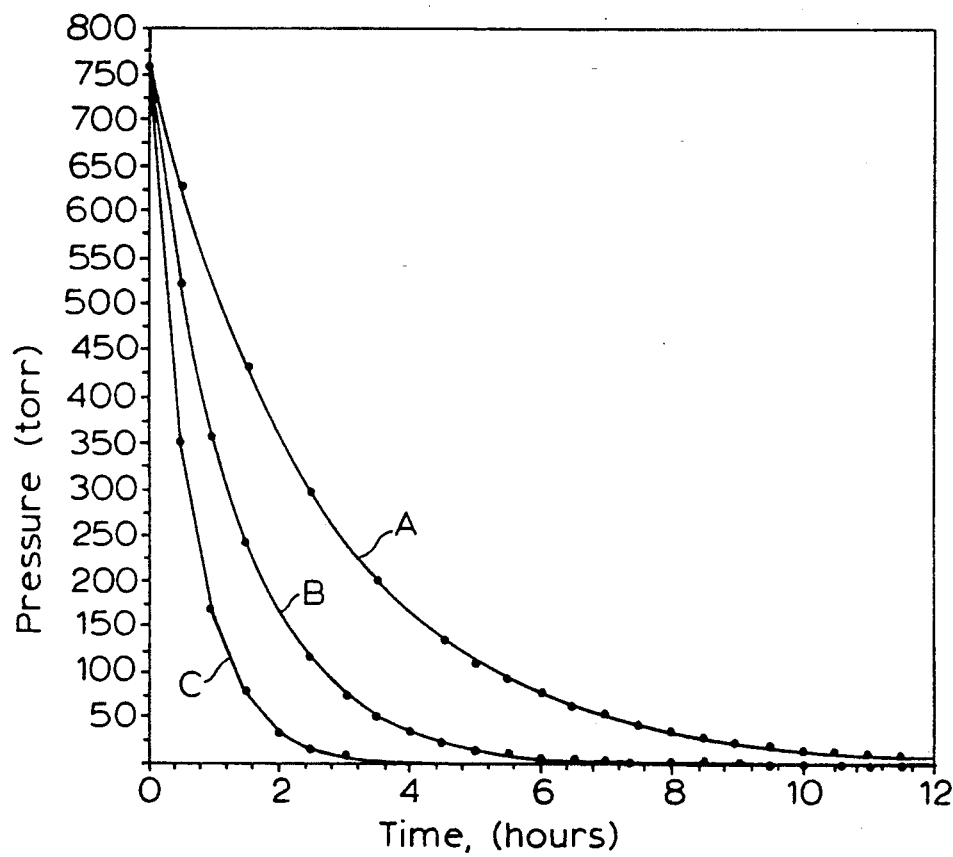
FIG. 11 is a graph of pressure, in torr, as a function of pumping time, in hours, at different evacuation rates, for vacuum sump tanks employed in a gas containment and treatment system of the type shown in FIGS. 6 and 7.

FIG. 11 is a graph of pressure, in torr, as a function of time, in hours, for pump-down rates of two cubic feet per minute (curve A), four cubic feet per minute (curve B) and eight cubic feet per minute (curve C), for the evacuation of 9000 liters of vacuum sump volume, e.g., in the form of tanks such as are shown in FIGS. 6 and 7 hereof. With a pumping rate of two cubic feet per minute (curve A), the 9000 liter vacuum sump volume will be reduced in pressure to below 50 torr in about seven hours. A pumping rate of four standard cubic feet per minute will remove 9000 liters of gas from the vacuum sump vessels, from a pressure of 760 torr to less than 50 torr, in about 4 hours (curve B). At a pumping rate of eight cubic feet per minute, the vacuum sump volume will be reduced in pressure from 760 torr to less than 50 torr in under 2 hours (curve C).

Figure 12:
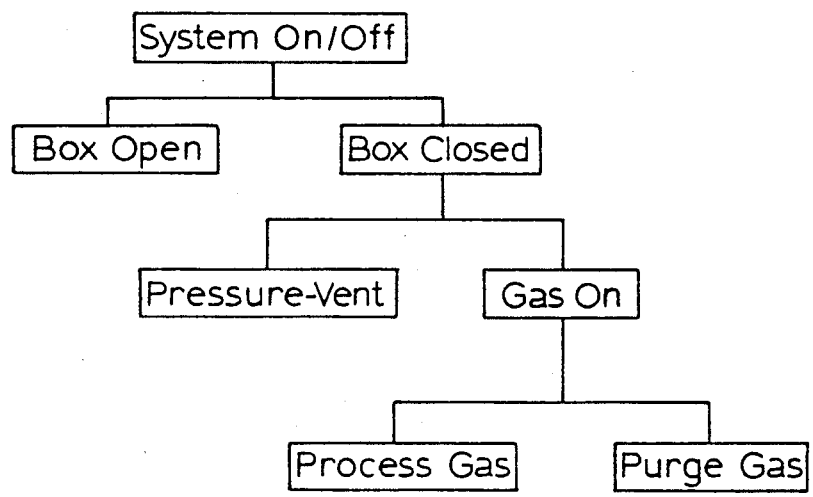
FIG. 12 is a logic control diagram for a gas containment and treatment system of the type shown in FIGS. 6 and 7.

FIG. 12 is a schematic diagram of the control states for a gas containment and treatment system according to the present invention, e.g., a system of a type as illustratively shown in FIG. 6 hereof.

A description of the operating logic of this system is set out below. A primary safety factor in the design of such gas containment and treatment system is the isolation of operating personnel from the hazardous gas and the containment of all hazardous gas in the event of a bulk leak. The gas cylinders in the gas cabinets employed in the system of the invention preferably are equipped with actuated valves which enable remote opening of the cylinder without a human operator being involved. A suitable actuated valve of such type is commercially available from Martin Technology (Middlebury, Conn.) as the Martin Technology Series 2020 valve.

Figure 13:
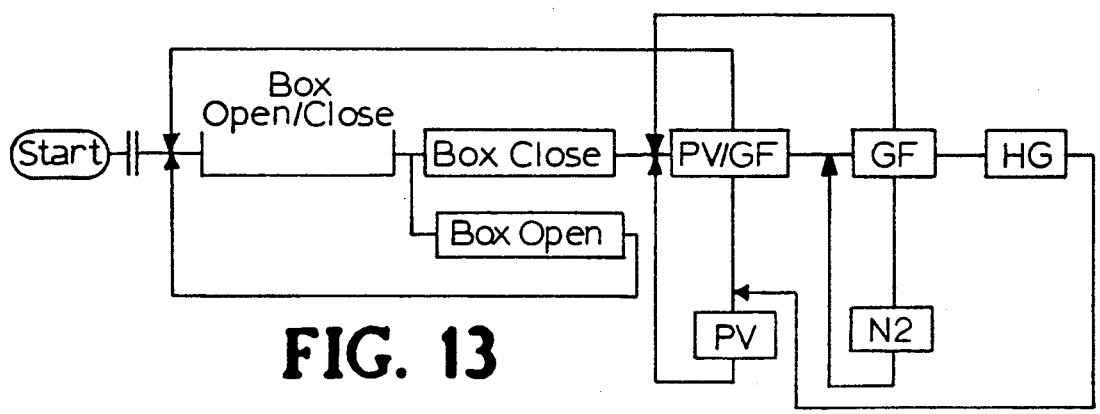
FIG. 13 is another logic control diagram for the gas containment and treatment system shown in FIGS. 6 and 7.

FIG. 13 shows another view of the logic control of the gas containment and treatment system, and the ensuing description will be in reference to both FIGS. 12 and 13.

When the gas containment and treatment system is "off," no electrical power is supplied to the control panel (see FIGS. 2 and 3). The gas cabinet in the outer enclosure (see FIG. 1) will be in a locked position ("Box Closed") and all the actuated valves will be normally closed. If the "System On/Off" switch is turned on, the pump in the outer enclosure (pump 120 in FIG. 1) will be actuated. The outer enclosure front face will be maintained in a locked condition during this stage.

If desired, pressure relief to the vacuum sumps can be arranged to be in a constantly enabled position, as a normal operating mode, utilizing a battery power supply or other back-up power source for the solenoid switch.

After the system is "on," the choice is made of whether the gas cabinet in the enclosure is to be opened. If the "Box Open" selection is made, all actuated valves are closed and an air cylinder lock on the face plate of the gas cylinder is retracted to an unlocked position. The face plate on the gas cabinet can then be removed.

If the "Box Closed" mode is selected, the face plate on the gas cabinet is locked by an air cylinder. A fast purge of the gas cabinet, e.g., at an inert gas flow rate on the order of 50 liters per minute may then be carried out. It will be appreciated that the specific volumetric flow rate and type of inert gas may be selectively varied depending on system requirements and configuration. During the fast purge event, no other system operations can be carried out.

After the timed inert gas purge is completed, a choice can be made between an automatic pressure vent cycle or actuation of the process gas or purge gas streams.

The vacuum pump in the scrubber unit will be actuated, along with the appropriate valve actuation, upon initiation of the pressure vent cycles.

In the logic diagram of FIG. 13, "PV" represents "purge vent" operation. "GF" represents "gas flow" and "HG" represents "hazardous gas."

In addition to the bulk gas leakage events referred to hereinabove, two other gas release occurrences can take place in the gas containment and treatment system.

One such occurrence involves failure of a fitting in the purge panel. In this event, the hazardous gas cylinder is closed by the actuated cylinder valve, and the released hazardous gas is carried by the inert "bleed stream" from the interior volume of the gas cabinet to the small scrubber in the outer enclosure of the gas supply and containment assembly, whereby the hazardous gas is sorptively removed by such small scrubber unit. After the gas cabinet is purged, repairs to the flow circuitry can be carried out.

A second leakage event is the failure of a cylinder valve on the gas cylinder to close. Under such condition, the hazardous gas must be vented and scrubbed. The gas can be released to at least two locations.

In a first mode, the gas can be passed through the downstream reactor or process chamber and then scrubbed by an effluent gas scrubber, such as scrubber of the type described in copending U.S. application Ser. No. 295,419.

In a second mode of operation, a vent line can be provided which extends above the main solenoid in the gas supply and containment assembly. The contents of the hazardous high pressure cylinder then are released into the vacuum sump system and scrubbed by passage through the sorbent beds in the scrubber unit. This second mode of operation has the advantage that the scrubber unit is provided as a dedicated unit which is capable of handling in a safe manner the entire contents of the gas cylinder.

Figure 14:
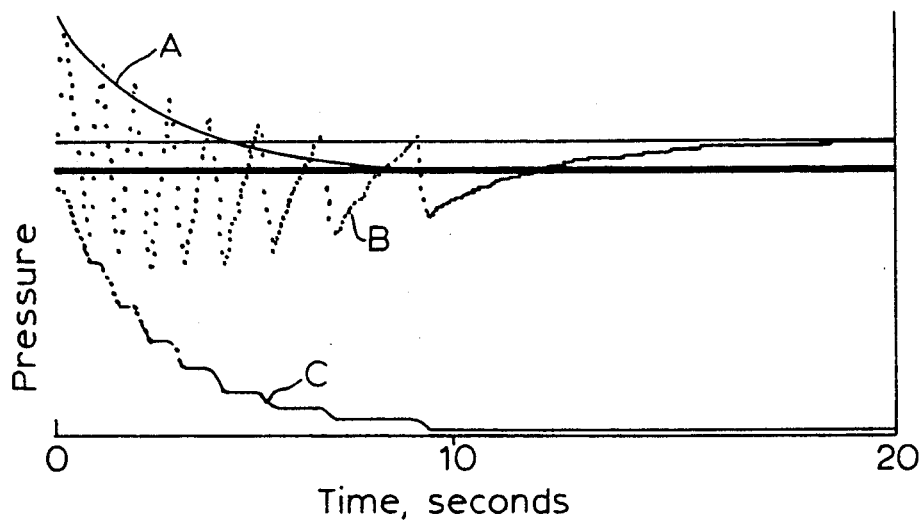
FIG. 14 is a graph of pressure as a function of time for a bulk gas leak in a gas containment and treatment system of the type shown in FIGS. 6 and 7, wherein the gas supply and containment assembly contains a 200 liter cylinder of gas at 2000 psig, which is exhausted to a 220 liter vacuum sump vessel.
Figure 15:
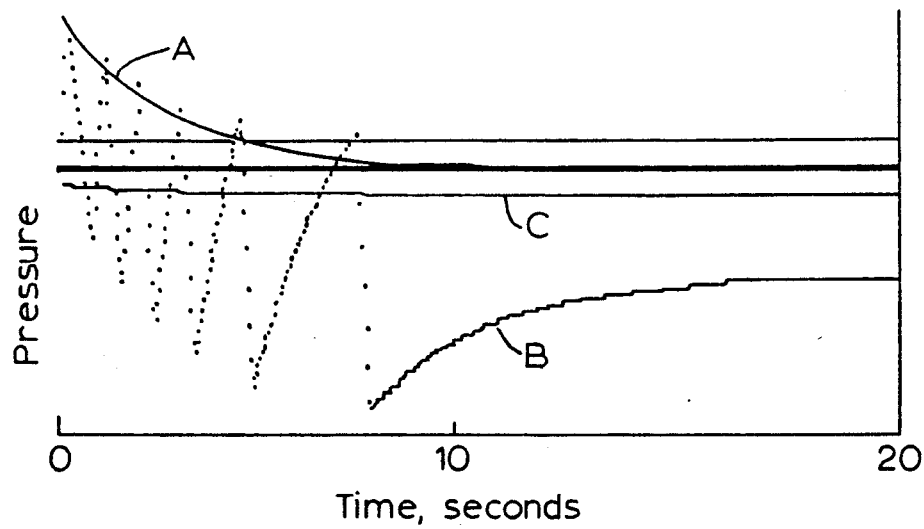
FIG. 15 is a graph of pressure as a function of time for a bulk gas leak in a gas containment and treatment system of the type shown in FIGS. 6 and 7, wherein the gas supply and containment assembly contains a 200 liter cylinder of gas at 2000 psig, which is exhausted to a 7500 liter vacuum sump vessel.

FIGS. 14 and 15 are plots of pressure as a function of time during bulk gas leakage in a gas supply and containment assembly of the type shown in FIG. 6, wherein the gas cabinet contains a high pressure gas cylinder with a volume of 200 liters. In the dynamic pressure plot of FIG. 14 the vacuum sump volume is 220 liters, and in the FIG. 15 dynamic pressure plot, the vacuum sump volume is 7500 liters.

In the plots of FIGS. 14 and 15, curve A represents the gas cylinder pressure which at time zero is 2000 psi and at 20 seconds is 0 psi. Curve B represents the pressure of the gas cabinet (inner box) which fluctuates during the gas excursion as shown. Curve C is the sump pressure curve, which varies as shown during the gas excursion. The pressure ranges for the respective curves thus are as follows: A (0 to 2000 psi), B (−2 to +2 psi), and C (0 to 14.7 psi), in FIG. 14. FIG. 15 shows the pressure/time curves A, B, and C in a corresponding system, but with a vacuum sump volume of 7500 liters.

In both systems, the delay time to gas evacuation to the vacuum sump vessels and scrubber unit is 100 millisecond, and the delay time for shutting off the gas evacuation system is 200 milliseconds.

As shown by the pressure/time plot of FIG. 14, the pressure level in the gas cabinet after occurrence of the bulk gas leak will oscillate between +2 psig and −2 psig, with the cylinder being fully vented in about 15 seconds. In the system reflected by this plot, the vacuum sump volume is only 10% greater than the gas cabinet volume (220 liters of vacuum sump volume versus 200 liters of high pressure gas cylinder volume). Even with this relatively small margin of safety, the vacuum sump vessels readily accommodate the high pressure release.

FIG. 15 represents the corresponding pressure/time plot for a vacuum sump volume of 7500 liters and a gas cylinder volume of 200 liters.

The oscillations shown in the pressure/time plots of FIGS. 14 and 15 are due to the delay times of the opening and closing of the solenoid to the vacuum sump system. In the curves shown in FIGS. 14 and 15, the delay times were 100 milliseconds for the opening of the solenoid and 200 milliseconds for the closing thereof. As the delay times increase, the pressure swings increase linearly.

The plots shown in FIGS. 14 and 15 are representative of worst case scenarios, as based on the assumption that the solenoid remains fully open or closed during the appropriate delay time. In actual operation, the solenoids do not remain in such static open or closed positions. Instead, a gradual opening and closing of the solenoid is anticipated, and the pressure swings corresponding will be significantly lessened.

The pressure swings are large in magnitude in instances where the volume of the sump vessel system is much larger than the venting high pressure gas cylinder volume. Such a situation may obtain where an array of gas supply and containment assemblies containing a corresponding array of different-sized high pressure cylinders is attached to a common header conduit, as may be done in the gas containment and treatment system shown in FIGS. 6 and 7. In such system arrangements, the vacuum sump vessels are appropriately sized for the largest volume release. If in such system one of the smaller high pressure gas cylinders were to fail, the delay in shutting of the solenoid at the end of the venting cycle could drive the interior volume gas pressure in the gas cabinet to a substantial negative pressure value, if a long response time in the pressure controlling hardware is present. For such reason, the pressure controlling hardware should be selected and arranged to provide a fast response time. Concurrently, the gas cabinet in the gas supply and containment assembly should be designed and tested to withstand the maximum pressure swings that may occur during gas cylinder and/or flow circuitry failures.

It will be appreciated that the gas supply and containment system of the present invention achieves a major advance in the art of gas management in semiconductor manufacturing as well as other industrial applications involving generation and/or use of hazardous gas constituents. The gas supply and containment system of the present invention has the following advantages:

(1) initial containment of hazardous gas leakages, by virtue of a "double cabinet" design having an interior pressure control system.
(2) ability to rapidly respond to a hazardous gas event, with the vacuum sumps providing high speed pumping and a large holding capacity for the bulk leakage gas.
(3) ability to rapidly clear the gas excursion event, by virtue of the capability of safely scrubbing the gas which is removed to the vacuum sump unit or units.

While the invention has been described herein with reference to specific aspects, features, and embodiments, it will be apparent that other variations, modifications, and embodiments are possible, and all such variations, modifications, and embodiments are to be regarded as being within the spirit and scope of the invention.

What is claimed is:

1. A sorbent composition comprising an arrangement of first and second sorbent beds, wherein the first sorbent bed comprises a hygroscopic aluminosilicate sorbent, and the second sorbent bed comprises an aluminosilicate sorbent impregnated with an aqueous base solution, wherein the first and second sorbent beds are arranged for initial gas contacting with the first sorbent bed and succeeding gas contacting with the second sorbent bed.

2. A composition according to claim 1, wherein the aluminosilicate sorbent comprises molecular sieve.

3. A sorbent composition according to claim 1, wherein the aqueous base solution comprises an alkali or alkaline earth metal hydroxide.

4. A sorbent composition according to claim 3, wherein the alkali metal hydroxide is selected from the group consisting of lithium hydroxide, sodium hydroxide, and calcium hydroxide.

5. A sorbent composition according to claim 1, wherein the first and second sorbent beds are vertically aligned with respect to one another, with the first sorbent bed overlying the second sorbent bed.

6. A sorbent composition according to claim 1, wherein the aluminosilicate sorbent impregnated with an aqueous base solution comprises a composition of from about 1% to about 5% by weight of base component, and from about 10% to about 25% by weight of water, based on the weight of aluminosilicate.

7. A sorbent composition according to claim 1, wherein the first sorbent bed does not exceed about 15% by volume of the volume of the second sorbent bed.

8. A sorbent composition according to claim 1, wherein the first sorbent bed has a volume which is from about 5% to about 15% of the volume of the second sorbent bed.

9. A sorbent composition according to claim 1, wherein the first sorbent bed has a volume which is from about 3% to about 20% of the volume of the second sorbent bed.

10. A sorbent composition according to claim 1, wherein the second sorbent bed comprises molecular sieve impregnated with an aqueous solution of lithium hydroxide.

11. A sorbent composition according to claim 10, wherein the ratio of lithium hydroxide to water to molecular sieve is on the order of 2:15:100 parts by weight, respectively.

* * * * *

UNITED STATES PATENT AND TRADEMARK OFFICE
CERTIFICATE OF CORRECTION

PATENT NO. : 5,151,395

DATED : September 29, 1992

INVENTOR(S) : Glenn M. Tom

It is certified that error appears in the above-identified patent and that said Letters Patent is hereby corrected as shown below:

Column 4, line 13, change "36:" to --36;--.
Column 14, lines 41-47 change "aluminosilicates" means a support composition including the fluorocarbon polymers. As used herein, the term elements..." to --and fluorocarbon polymers. As used herein, the term "aluminosilicates" means a support composition including the elements...--.

Column 8, line 16, lines 17 and 18 should be flush left, not indented.

Column 21, line 14, change "t he" to --the--.

Signed and Sealed this

Twenty-ninth Day of March, 1994

Attest:

BRUCE LEHMAN

*Attesting Officer*  *Commissioner of Patents and Trademarks*